(12) United States Patent
Tong et al.

(10) Patent No.: US 12,273,197 B2
(45) Date of Patent: Apr. 8, 2025

(54) METHOD FOR DETERMINING AUXILIARY BIT OF POLAR CODE AND APPARATUS

(71) Applicant: HUAWEI TECHNOLOGIES CO., LTD., Shenzhen (CN)

(72) Inventors: Jiajie Tong, Hangzhou (CN); Xianbin Wang, Hangzhou (CN); Huazi Zhang, Hangzhou (CN); Shengchen Dai, Hangzhou (CN); Rong Li, Hangzhou (CN); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/328,137

(22) Filed: Jun. 2, 2023

(65) Prior Publication Data
US 2023/0318739 A1 Oct. 5, 2023

Related U.S. Application Data

(63) Continuation of application No. PCT/CN2021/135211, filed on Dec. 3, 2021.

(30) Foreign Application Priority Data

Dec. 3, 2020 (CN) .......................... 202011394710.9

(51) Int. Cl.
*H04L 1/00* (2006.01)
*H03M 13/00* (2006.01)
*H03M 13/09* (2006.01)

(52) U.S. Cl.
CPC .......... *H04L 1/0057* (2013.01); *H03M 13/09* (2013.01); *H03M 13/611* (2013.01); *H04L 1/0042* (2013.01)

(58) Field of Classification Search
CPC ... H04L 1/0057; H04L 1/0042; H04L 1/0041; H04L 1/0067; H04L 1/0052;
(Continued)

(56) References Cited

U.S. PATENT DOCUMENTS

| 2018/0076922 A1* | 3/2018 | Zhang | H03M 13/13 |
| 2019/0207711 A1* | 7/2019 | Li | H03M 13/618 |
| 2020/0007163 A1 | 1/2020 | Huangfu et al. | |

FOREIGN PATENT DOCUMENTS

CN 110048726 A 7/2019

OTHER PUBLICATIONS

Song Wenqing et al: "Low-complexity segmented CRC-aided SC stack decoder for polar codes", 2016 50th Asilomar Conference on Signals, Systems and Computers, IEEE, Nov. 6, 2016 (Nov. 6, 2016), pp. 1189-1193, XP033072790.
(Continued)

*Primary Examiner* — Thien Nguyen
(74) *Attorney, Agent, or Firm* — HAUPTMAN HAM, LLP

(57) ABSTRACT

A method for determining an auxiliary bit of a polar code and an apparatus. At least K sub-channels are determined based on reliability of a first sub-channel set, where the K sub-channels carry information bits. S sub-channel subsets are determined based on the first sub-channel set, an $i^{th}$ sub-channel subset in the S sub-channel subsets includes Ji sub-channels carrying auxiliary bits and Ki sub-channels in the K sub-channels. Sequence numbers of the Ji sub-channels carrying the auxiliary bits are after sequence numbers of the Ki sub-channels. The auxiliary bits are known redundancy check RC bits. Polar encoding is performed on the information bits and the auxiliary bits, to output polar-encoded data.

20 Claims, 11 Drawing Sheets

(58) Field of Classification Search
CPC ...... H04L 1/0061; H04L 1/004; H03M 13/09; H03M 13/611; H03M 13/2906; H03M 13/13
See application file for complete search history.

(56) References Cited

OTHER PUBLICATIONS

Extended European Search Report issued in corresponding European Application No. 21900087.4, dated Jun. 26, 2024, pp. 1-14.
International Search Report issued in corresponding International Application No. PCT/CN2021/135211, dated Feb. 22, 2022, pp. 1-10.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

100

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

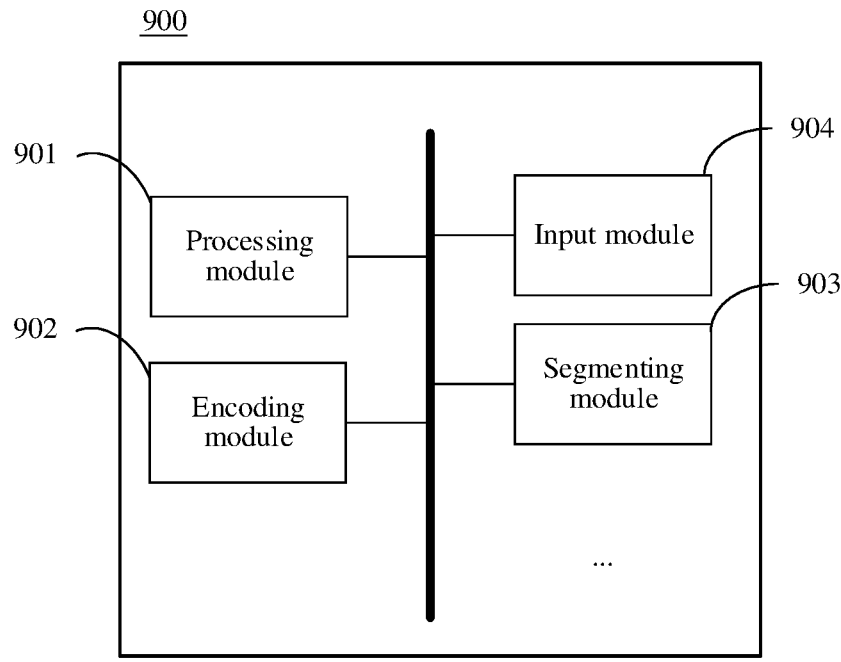

FIG. 9

Receive an encoded sequence, where the encoded sequence is obtained by performing polar encoding on a first bit sequence, a first sub-channel set corresponding to the first bit sequence includes at least K sub-channels determined based on reliability of the first sub-channel set, the K sub-channels carry information bits, the first sub-channel set includes S sub-channel subsets, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers ⟶ 1001

Perform polar decoding based on the encoded sequence, to obtain the information bits ⟶ 1002

FIG. 10

METHOD FOR DETERMINING AUXILIARY BIT OF POLAR CODE AND APPARATUS

CROSS-REFERENCE TO RELATED APPLICATIONS

This application is a continuation of International Application No. PCT/CN2021/135211, filed on Dec. 3, 2021, which claims priority to Chinese Patent Application No. 202011394710.9, filed on Dec. 3, 2020. The disclosures of the aforementioned applications are hereby incorporated by reference in their entireties.

BACKGROUND

A polar code (polar code) is a linear block error correction code for improving an overall transmission capacity through channel polarization. Specifically, the polar code is designed such that information bits are transmitted on more-reliable sub-channels (for example, sub-channels with less noise), and fixed (frozen) bits are transmitted on less-reliable sub-channels (for example, sub-channels with more noise). In a conventional technology, a cyclic redundancy check CRC bit and the like are used to assist in decoding. Determination of factors, such as a quantity, types, and locations, of auxiliary bits is a key to polar code construction, and affects polar code performance.

SUMMARY

Embodiments described herein disclose a method for determining an auxiliary bit of a polar code and an apparatus. Under a specific condition, this communication method achieves performance equivalent to that of a conventionally constructed polar code, and compared with a decoder for a conventionally constructed polar code, reduces an area of a decoder chip and lower complexity of decoding implementation.

According to a first aspect, at least one embodiment provides a communication method for polar code encoding. The method includes: determining at least K sub-channels based on reliability of a first sub-channel set, where the K sub-channels carry information bits, S sub-channel subsets are determined based on the first sub-channel set, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers; and performing polar encoding on the information bits and the auxiliary bits, and outputting polar-encoded data. The method further includes obtaining the information bits. Optionally, the information bits are obtained before the at least K sub-channels are determined based on the reliability of the first sub-channel set.

Use of the communication method provided in at least one embodiment effectively reduces overheads caused by calculation of the auxiliary bits such as a CRC, lower implementation complexity, and reduce area overheads of a decoder. In addition, simulation verification shows that the method has good performance under specific conditions such as a specific code length and a specific code rate, and maintains FER performance and FAR performance that are not apparently different from a conventional polar code encoding/decoding method.

Correspondingly, according to a second aspect, at least one embodiment further provides a communication method for polar code decoding. The method includes: receiving an encoded sequence, where the encoded sequence is obtained by performing polar encoding on a first bit sequence, a first sub-channel set corresponding to the first bit sequence includes at least K sub-channels determined based on reliability of the first sub-channel set, the K sub-channels carry information bits, the first sub-channel set includes S sub-channel subsets, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers; and performing polar decoding based on the encoded sequence, to obtain the information bits.

In at least one embodiment, the first sub-channel set is a channel set from which a shorten sub-channel is excluded. Rate matching is a common means for implementing any code length. Sub-channels that are subject to impact of rate matching are considered for the first sub-channel set, which is a more specific implementation solution. The impact of rate matching refers to impact of an operation such as puncturing, shortening, or repetition. More specifically, for the impact of rate matching, sub-channels that are frozen in consideration of rate matching is also included.

In at least one embodiment, the determining at least K sub-channels based on reliability of a first sub-channel set includes: determining (K+J) sub-channels based on the reliability of the first sub-channel set, where the J sub-channels carry auxiliary bits. In this implementation, the (K+J) sub-channels are selected based on reliability. Such a design makes the solution clear, and from an implementation perspective, does not increase complexity of solution implementation.

In at least one embodiment, the Ki sub-channels carry information bits. To be specific, all the Ki sub-channels allocated in the $i^{th}$ segment carry the information bits.

In at least one embodiment, (Ki+Ji) sub-channels are determined based on reliability of the $i^{th}$ sub-channel subset, where the (Ki+Ji) sub-channels carry information bits and the auxiliary bits. After the K sub-channels are determined, the (Ki+Ji) sub-channels that carry the information bits and the auxiliary bits in each segment used to be considered based on the K sub-channels, to prepare for further determining locations for the information bits and the auxiliary bits subsequently. In at least one embodiment, reliability of the (Ki+Ji) sub-channels is higher than reliability of a remaining sub-channel in the $i^{th}$ sub-channel subset.

In at least one embodiment, the determining at least K sub-channels based on reliability of a first sub-channel set includes determining K sub-channels based on the reliability of the first sub-channel set. In this implementation, the K sub-channels are selected based on reliability. Compared with selecting (K+J) sub-channels, the step of determining at least K sub-channels are simpler.

In at least one embodiment, sequence numbers of the Ji sub-channels are greater than a sequence number of a remaining sub-channel in the $i^{th}$ sub-channel subset. In other words, placement locations (sequence numbers) of the auxiliary bits are the last locations of physical addresses or natural sequence numbers in optional locations in the $i^{th}$ segment, and the locations of the auxiliary bits are after the information bits and the frozen bits (if any).

In at least one embodiment, the Ki sub-channels are determined based on reliability of a third sub-channel set, where the third sub-channel set is the $i^{th}$ sub-channel subset from which the Ji sub-channels are excluded, and the Ki sub-channels carry the information bits. Following the foregoing implementation, in this implementation, after Ji sub-channels for placing the auxiliary bits are determined, locations for placing the information bits are selected from a set of remaining sub-channels. More specifically, the locations is selected based on reliability. In at least one embodiment, reliability of the Ki sub-channels is higher than reliability of a remaining sub-channel in the third sub-channel set.

In at least one embodiment, the first sub-channel set is segmented, where the first sub-channel set includes the S sub-channel subsets.

In at least one embodiment, the K sub-channels further carry a pre-frozen bit.

In at least one embodiment, a total quantity J of the auxiliary bits is determined based on a quantity T of times of checking a check result of the auxiliary bits during polar decoding, and T is a positive integer. In a specific case or some cases, the total quantity J of the auxiliary bits is greater than or equal to $\log_2(T)$. Alternatively, the total quantity J of the auxiliary bits is greater than or equal to $\log_2(T*CN)$, and CN is a quantity of candidate locations that are to be blindly detected. Alternatively, the total quantity J of the auxiliary bits is greater than or equal to $\Sigma_{i \in S}(\log(T_i)+C_i)$, and $C_i$ is an integer. Alternatively, the total quantity J of the auxiliary bits is a nonnegative integer power of 2. More specifically, in at least one embodiment, in a communication system without blind detection, the total quantity J of the auxiliary bits is greater than or equal to $\log_2(T)$. Alternatively, in a communication system with blind detection, the total quantity J of the auxiliary bits is greater than or equal to $\log_2(T*CN)$. CN is a quantity of candidate locations that are to be blindly detected. Alternatively, in an asymmetric block-combined ABC polar code communication system, the total quantity J of the auxiliary bits is greater than or equal to $\Sigma_{i \in S}(\log(T_i)+C_i)$, and $C_i$ is an integer. In at least one embodiment, in a communication system with low power consumption, the total quantity J of the auxiliary bits is a nonnegative integer power of 2. The foregoing methods for determining quantities in different scenarios is used with reference to each other, or are interchangeable. For example, in a communication system without blind detection, the total quantity J of the auxiliary bits is greater than or equal to $\log_2(T*CN)$, or the total quantity J is greater than or equal to $\Sigma_{i \in S}(\log(T_i)+C_i)$. From a perspective of simplified engineering implementation, a method for determining a quantity J of auxiliary bits is used for compatibility with a plurality of different scenarios. For example, the total quantity J is a nonnegative integer power of 2.

In at least one embodiment, a value of the auxiliary bit is 0 or 1. Alternatively, a value of the auxiliary bit is determined based on a part or all of a terminal identifier UE-ID, or a value of the auxiliary bit is determined based on a part or all of a base station identifier BS-ID. Alternatively, a value of the auxiliary bit is determined based on a part or all of the terminal identifier UE-ID and a part or all of the base station identifier BS-ID.

According to a third aspect, at least one embodiment provides a communication apparatus. The apparatus includes a logic circuit, configured to determine at least K sub-channels based on reliability of a first sub-channel set, where the K sub-channels carry information bits, S sub-channel subsets are determined based on the first sub-channel set, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers; and perform polar encoding on the information bits and the auxiliary bits; and a communication interface, configured to output polar-encoded data. Use of the apparatus provided in at least one embodiment effectively reduces overheads caused by calculation of the auxiliary bits such as a CRC, lower implementation complexity, and reduce area overheads of a decoder. In addition, simulation verification shows that the apparatus has good performance under specific conditions such as a specific code length and a specific code rate, and maintains FER performance and FAR performance that are not apparently different from a conventional polar code encoding/decoding apparatus.

Correspondingly, according to a fourth aspect, at least one embodiment further provides a communication apparatus for decoding. The apparatus includes an obtaining module, configured to obtain an encoded sequence, where the encoded sequence is obtained by performing polar encoding on a first bit sequence, a first sub-channel set corresponding to the first bit sequence includes at least K sub-channels determined based on reliability of the first sub-channel set, the K sub-channels carry information bits, the first sub-channel set includes S sub-channel subsets, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers; and a decoding module, configured to perform polar decoding based on the encoded sequence, to obtain the information bits.

In at least one embodiment, the first sub-channel set is a channel set from which a shorten sub-channel is excluded. Rate matching is a common means for implementing any code length. Sub-channels that are subject to impact of rate matching are considered for the first sub-channel set, which is a more specific implementation solution. The impact of rate matching refers to impact of an operation such as puncturing, shortening, or repetition. More specifically, for the impact of rate matching, sub-channels that are frozen in consideration of rate matching is also included.

In at least one embodiment, that the at least K sub-channels are determined based on the reliability of the first sub-channel set includes: determining (K+J) sub-channels based on the reliability of the first sub-channel set, where the J sub-channels carry auxiliary bits. In this implementation, the (K+J) sub-channels are selected based on reliability. Such a design makes the solution clear, and from an implementation perspective, does not increase complexity of solution implementation.

In at least one embodiment, the Ki sub-channels carry information bits. To be specific, all the Ki sub-channels allocated in the $i^{th}$ segment carry the information bits.

In at least one embodiment, (Ki+Ji) sub-channels are determined based on reliability of the $i^{th}$ sub-channel subset, where the (Ki+Ji) sub-channels carry information bits and the auxiliary bits. After the K sub-channels are determined, the (Ki+Ji) sub-channels that carry the information bits and the auxiliary bits in each segment are to be considered based on the K sub-channels, to prepare for further determining locations for the information bits and the auxiliary bits subsequently. In at least one embodiment, reliability of the (Ki+Ji) sub-channels is higher than reliability of a remaining sub-channel in the $i^{th}$ sub-channel subset.

In at least one embodiment, the determining at least K sub-channels based on reliability of a first sub-channel set includes determining K sub-channels based on the reliability of the first sub-channel set. In this implementation, the K sub-channels are selected based on reliability. Compared with selecting (K+J) sub-channels, the step of determining at least K sub-channels are simpler.

In at least one embodiment, sequence numbers of the Ji sub-channels are greater than a sequence number of a remaining sub-channel in the $i^{th}$ sub-channel subset. In other words, placement locations (sequence numbers) of the auxiliary bits need to be last locations of physical addresses or natural sequence numbers in optional locations in the $i^{th}$ segment, and the locations of the auxiliary bits are after the information bits and the frozen bits (if any).

In at least one embodiment, the logic circuit is further configured to determine the Ki sub-channels based on reliability of a third sub-channel set, where the third sub-channel set is the $i^{th}$ sub-channel subset from which the Ji sub-channels are excluded, and the Ki sub-channels carry the information bits. Following the foregoing implementation, in this implementation, after Ji sub-channels for placing the auxiliary bits are determined, locations for placing the information bits are selected from a set of remaining sub-channels. More specifically, the locations is selected based on reliability. In at least one embodiment, reliability of the Ki sub-channels is higher than reliability of a remaining sub-channel in the third sub-channel set.

In at least one embodiment, the logic circuit is further configured to segment the first sub-channel set, where the first sub-channel set includes the S sub-channel subsets.

In at least one embodiment, the K sub-channels further carry a pre-frozen bit.

In at least one embodiment, a total quantity J of the auxiliary bits is determined based on a quantity T of times of checking a check result of the auxiliary bits during polar decoding, and T is a positive integer. In at least one embodiment, in a communication system without blind detection, the total quantity J of the auxiliary bits is greater than or equal to $\log_2(T)$. Alternatively, in a communication system with blind detection, the total quantity J of the auxiliary bits is greater than or equal to $\log_2(T*CN)$. CN is a quantity of candidate locations that need to be blindly detected. Alternatively, in an asymmetric block-combined ABC polar code communication system, the total quantity J of the auxiliary bits is greater than or equal to $\Sigma_{i \in S}(\log(T_i)+C_i)$, and $C_i$ is an integer. In at least one embodiment, in a communication system with low power consumption, the total quantity J of the auxiliary bits is a nonnegative integer power of 2.

In at least one embodiment, a value of the auxiliary bit is 0 or 1. Alternatively, a value of the auxiliary bit is determined based on a part or all of a terminal identifier UE-ID, or a value of the auxiliary bit is determined based on a part or all of a base station identifier BS-ID. Alternatively, a value of the auxiliary bit is determined based on a part or all of the terminal identifier UE-ID and a part or all of the base station identifier BS-ID.

According to a fifth aspect, at least one embodiment provides a communication apparatus, including a processor and a memory. The memory stores at least one group of programs, and the programs is executed by the processor, to enable the communication apparatus to be configured to perform the method according to the first aspect and at least one embodiment of the first aspect, or perform the method according to the second aspect and the possible implementations of the second aspect.

According to a sixth aspect, at least one embodiment provides a computer-readable storage medium. The computer-readable storage medium is configured to store instructions. In response to the instructions being executed, the method according to the first aspect and at least one embodiment of the first aspect is implemented, or the method according to the second aspect and the possible implementations of the second aspect is implemented.

According to a seventh aspect, at least one embodiment provides a computer program product, including a computer program. In response to being executed by a processor, the computer program implements the method according to the first aspect and at least one embodiment of the first aspect, or implements the method according to the second aspect and at least one embodiment of the second aspect.

For technical effects brought by the fifth aspect to the seventh aspect, refer to technical effects brought by the first aspect and at least one embodiment of the first aspect, or refer to technical effects brought by the second aspect and at least one embodiment of the second aspect. Details are not described again.

According to an eighth aspect, a communication system is provided. The communication system includes the communication apparatus for encoding and the communication apparatus for decoding according to any one of the third aspect and the fourth aspect, or the communication apparatus for encoding and the communication apparatus for decoding according to the fifth aspect.

BRIEF DESCRIPTION OF DRAWINGS

To clearly understand technical solutions and advantages of embodiments described herein, the following descriptions is read with reference to the accompanying drawings.

FIG. 1 is a schematic diagram depicting how a polar encoding generator matrix is generated from a core;

FIG. 9 is a schematic diagram of a communication apparatus 900 for polar encoding according to at least one embodiment;

FIG. 10 is a schematic flowchart of a communication method for polar decoding according to at least one embodiment;

DESCRIPTION OF EMBODIMENTS

Figure 2:
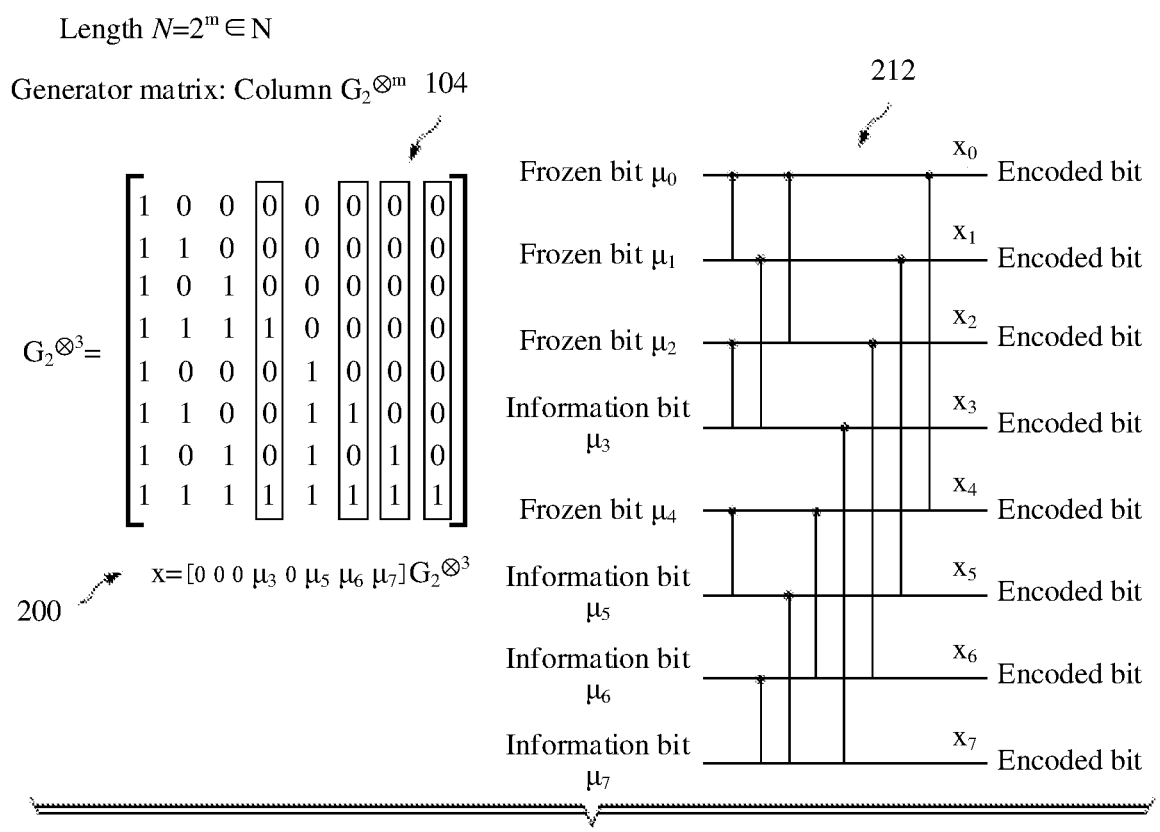
FIG. 2 is a schematic diagram of example usage of and an example polar encoder of a polar encoding generator matrix for generating a codeword.

The following describes embodiments in detail with reference to the accompanying drawings. However, it should be understood that a specific concept provided in embodiments described herein is implemented in a plurality of specific environments. The specific embodiments are merely used to describe and explain specific manners of implementations of at least one embodiment, and should not be understood as limiting the scope embodiments described herein.

In embodiments described herein, claims, and accompanying drawings, the terms "first", "second", "third", "fourth", and the like are intended to distinguish between different objects but do not indicate a particular order. In addition, the terms "including", "having", or any other variant thereof are intended to cover a non-exclusive inclusion. For example, a process, a method, a system, a product, or a device that includes a series of steps or units is not limited to the listed steps or units, but optionally further includes unlisted steps or units, or optionally further includes other inherent steps or units of the process, the method, the product, or the device.

An "embodiment" mentioned herein means that a particular feature, structure, or characteristic described with reference to this embodiment is included in at least one embodiment. The phrase appears at various locations in embodiments described herein neither necessarily mean a same embodiment, nor mean an independent or optional embodiment exclusive from another embodiment. A person skilled in the art understands that embodiments described herein are able to be combined with another embodiment.

In embodiments described herein, "at least one (item)" means one or more, "a plurality of" means two or more, "at least two (items)" means two, three, or more, and "and/or" is used to describe an association relationship between associated objects and indicates that three relationships exist. For example, "A and/or B" indicates the following three cases: Only A exists, only B exists, and both A and B exist, where A and B is singular or plural. The character "/" generally indicates an "or" relationship between associated objects. "At least one of the following items (pieces)" or a similar expression thereof refers to any combination of these items, including any combination of singular items (pieces) or plural items (pieces). For example, at least one of a, b, or c indicates a, b, c, "a and b", "a and c", "b and c", or "a, b, and c", where a, b, and c are singular or plural.

The terms "sub-channel" and "channel" in the claims and embodiments described herein and related terms, such as "sub-channel set" and "channel set", are generally not distinguished in meaning, and only comply with a language habit of a person skilled in the art, to facilitate understanding of a person skilled in the art. The foregoing terms are not distinguished in a strict sense during use, and are used interchangeably. Without loss of generality, embodiments described herein use "sub-channel" as an example for description.

To help understand the subsequent embodiments in more detail and other inventive aspects of the embodiments, the following briefly describes a polar code.

An encoding policy of a polar code, or referred to as a Polar code (Polar Codes), is to transmit, through a noise-free channel, information that is useful to a user, and to transmit agreed information or not to transmit information on a noisy channel, so as to improve reliability of data transmission and ensure communication quality. The polar code is also a linear block code, and has low encoding and decoding complexity. An encoding matrix of the polar code is $G_N$, and an encoding process is expressed as $x_1^N = u_1^N G_N$, where $u_1^N = (u_1, u_2 \ldots u_N)$ is a binary row vector, and a length is N (that is, a code length). $G_N$ is an N×N matrix generated from a core. FIG. 1 is a diagram illustrating, through an illustrative example, how a polar encoding generator matrix is generated from a core $G_2$ 100. FIG. 1 is merely an example. There is a core in another form, for example, a prime number core (for example, 3×3 or 5×5) or a combination of (prime number or non-prime number) cores for generating a higher-order core. Polarization comes from a "nesting" mode, and a generator matrix is created from a core (or a combination of cores) in a "nesting" mode. In FIG. 1, a 2-order Kronecker product matrix $G_2^{\otimes 2}$ 102 and a 3-order Kronecker product matrix $G_2^{\otimes 3}$ 104 are examples of the polar encoding generator matrix. The method for generating a matrix shown in FIG. 1 is extended to produce an m-order Kronecker product matrix $G_2^{\otimes m}$. For example, $G_N = G_2^{\otimes(\log_2(N))}$, and $G_2^{\otimes(\log_2(N))}$ is defined as a Kronecker (Kronecker) product of $\log_2 N$ matrices G2.

A polar code is formed based on a Kronecker product matrix of the matrix core $G_2$ 100. For a polar code whose codeword length satisfies $N=2^m$, the generator matrix is $G_2^{\otimes m}$. FIG. 2 is a schematic diagram illustrating example usage of and an example polar encoder of a polar encoding generator matrix for generating a codeword. In FIG. 2, a generator matrix $G_2^{\otimes 3}$ 104 is used to generate a codeword whose length is $2^3=8$. A codeword x is formed based on a product of an input vector $u=[0\ 0\ 0\ u_3\ 0\ u_5\ u_6\ u_7]$ and the generator matrix $G_2^{\otimes 3}$ 104, as shown by 200. The input vector u includes information bits and fixed or frozen bits. In a specific example shown in FIG. 2, because N=8, the input vector u is an 8-bit vector, and the codeword x is an 8-bit vector. The input vector has frozen bits at locations 0, 1, 2, and 4, and information bits at locations 3, 5, 6, and 7. 212 represents an example implementation of an encoder that generates a codeword, where the frozen bits are all set to 0, and a bold "." symbol represents modulo-2 addition. For the example in FIG. 2, an N=8-bit input vector is formed based on K=4 information bits and N−K=4 frozen bits. The encoder is referred to as a polar encoder, and a decoder configured to decode a polar code is referred to as a polar decoder. In the example shown in FIG. 2, the frozen bits are set to zero. However, the frozen bits is set to other fixed bit values known to the encoder and decoder. For ease of description, all frozen bits considered in embodiments described herein are frozen bits whose value is zero, and are also generally preferably all-zero frozen bits.

In a process $x_1^N = u_1^N G_N$ of encoding the polar code, some bits in $u_1^N$ carry information, and are referred to as a set of information bits, where a set of indexes of the bits is denoted as A. Some other bits are set to a fixed value agreed on by a receive end and a transmit end in advance, and are referred to as a set of fixed bits or a set of frozen bits (frozen bits), where a set of indexes of the bits is indicated by a complementary set $A^c$ of A. The process of encoding the polar code is equivalent to $x_1^N = u_A G_N(A) \oplus u_{A^c} G_N(A^c)$, where $G_N(A)$ is a sub-matrix that is in $G_N$ and that is obtained from rows corresponding to the indexes in the set A, and $G_N(A^C)$ is a sub-matrix that is in $G_N$ and that is obtained from rows corresponding to the indexes in the set $A^c$. $u_A$ is a set of information bits in $u_1^N$, where a quantity of the information bits in the set is K. Generally, various check bits including, but not limited to, a cyclic redundancy check (Cyclic Redundancy Check, CRC for short) bit and a parity check (Parity Check, PC for short) bit, are also included in the set of information bits. $u_{A^c}$ is a set of fixed bits in $u_1^N$, a quantity of the fixed bits is (N–K), and the fixed bits are known bits. These fixed bits are usually set to 0. However, the fixed bits is set to any value provided that the value is agreed on by the receive end and the transmit end in advance. Therefore, the encoding output of the polar code is simplified as $x_1^N = u_A G_N$ (A), where $u_A$ is the set of information bits in $u_1^N$, and $u_A$ is a row vector with a length K, to be specific, |A|=K, where |•| indicates a quantity of elements in a set, K is an information block size, $G_N(A)$ is a sub-matrix that is in the matrix $G_N$ and that is obtained from rows corresponding to the indexes in the set A, and $G_N(A)$ is a K×N matrix.

A construction process of the polar code is a selection process of the set A. This determines performance of the polar code. The construction process of the polar code is usually determining, based on a code length N of a mother code, that there are N polarized channels in total, corresponding to N rows of the encoding matrix respectively. Reliability of the polarized channels is calculated. Indexes of first K polarized channels with high reliability are used as elements of the set A, and indexes corresponding to remaining (N–K) polarized channels are used as elements of the set A of indexes of fixed bits. The set A determines locations of the information bits, and the set $A^c$ determines locations of the fixed bits. A sequence number of a polarized channel is a location index of an information bit or a fixed bit, that is, a location index in $u_1^N$.

The encoding matrix shows that the code length of an original polar code (the mother code) is an integer power of 2. During actual application, a polar code of any code length is to be implemented through rate matching. A puncturing (puncture) or shortening (shorten) solution is used to implement rate matching. During encoding, a mother code that exceeds a target code length is punctured or shortened to achieve the target code length, and during decoding, the target code length is restored to the mother code length through padding.

During polar encoding, an auxiliary bit is added to an information bit string, to facilitate decoding and error detection or correction at the receiver and improve performance of the polar code. For auxiliary bits in the following embodiments, a redundancy check RC bit is considered to be used as an auxiliary bit, and certainly, other types of auxiliary bits, for example, other auxiliary bits or codes such as a parity check (parity check, PC) bit, a cyclic redundancy check (Cyclic Redundancy Check, CRC) bit, an error detection code (EDC), a checksum bit, a hash function bit, a guaranteed cipher, a repetition code, or an error detection bit, are also considered to be used for applying the methods disclosed herein. A key to constructing a polar code is to determine to select or allocate sub-channels for information bits and allocate which sub-channels to frozen bits. In some embodiments, the auxiliary bit is considered as a type of information bit, and a more reliable sub-channel is selected or allocated for the auxiliary bit used as the information bit.

A method for constructing a polar code is an online construction manner. In this case, a parameter for online construction is related to a signal-to-noise ratio SNR, and the transmit end and the receive end cannot obtain an accurate signal-to-noise ratio parameter at the same time (or is to obtain the accurate signal-to-noise ratio parameter by using additional overheads), and the online construction uses additional complexity. In addition, information bit locations are to be separately stored for different encoding lengths and information bit lengths. Alternatively, a construction method irrelevant to a signal-to-noise ratio is used, for example, construction is performed based on a PW (Polarization Weight, polarization weight) value. A sorting sequence of PW values is a reliability sorting sequence of the polar code, and is for selection of information bits. In response to an information bit locations being selected based on a PW, the performance is further improved. Optionally, construction based on a row weight of a generator matrix or a Hamming weight of a sub-channel is further considered. A hamming weight of a sub-channel is defined herein to be a weight of a row of a generator matrix. In a polar code, a Hamming weight of a sub-channel is related to a row weight of the sub-channel in a generator matrix of the sub-channel (row weight=2^(Hamming weight)). Sub-channel reliability is specified in one or more ordered sequences or the like. A separate and nested sub-channel ordered sequence independent of signal to noise ratio is calculated for a code length $N_{max}$, and an ordered sequence with a shorter code length N is selected from a longer $N_{max}$ sequence. Alternatively, a plurality of ordered sequences is calculated based on different mother code lengths $N_i$, and one of mother code length sequences is selected for a particular code based on a preferred code length. Another option is calculating a plurality of ordered sequences in terms of SNR values and selecting an ordered sequence based on a measured SNR.

Figure 3:
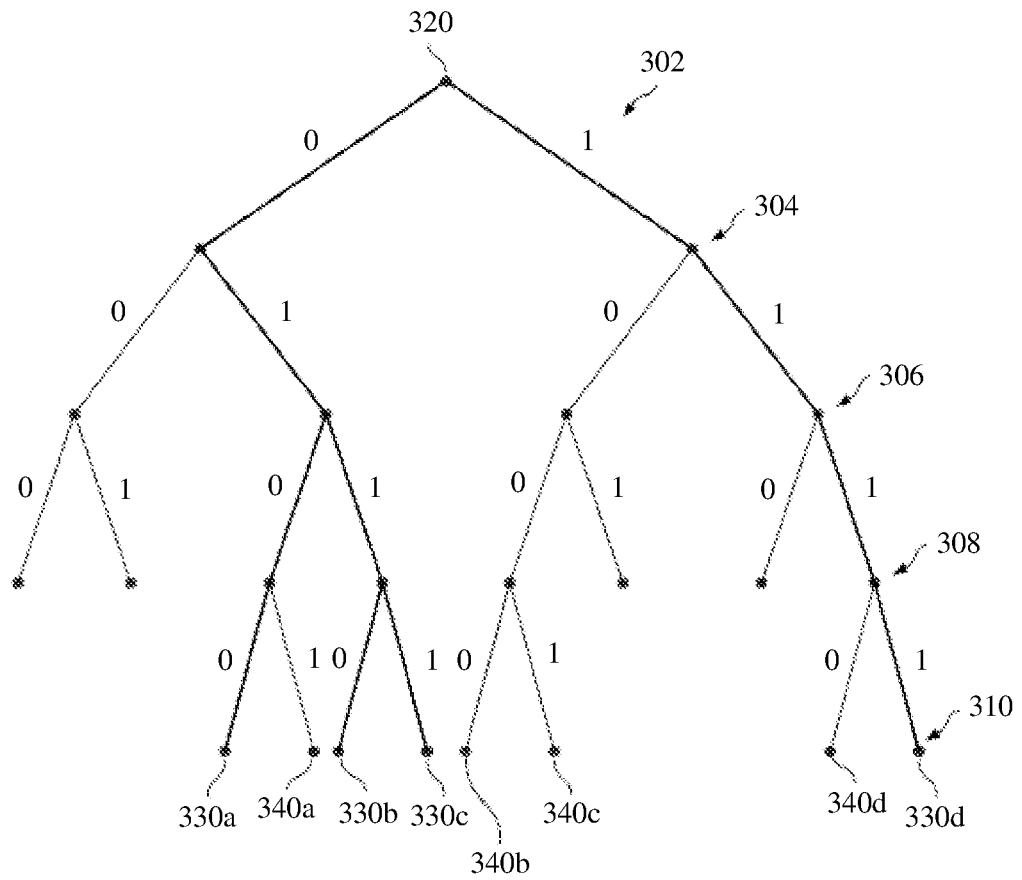
FIG. 3 is a schematic diagram of a partial example decision tree whose width is limited by a maximum given list size L and that is used in a successive cancellation list (Successive Cancellation List, SCL) polar decoder.

FIG. 3 is a schematic diagram of a decision tree used in an SCL polar decoder, where a width of the decision tree is limited by a maximum given list size. In FIG. 3, a list size L is 4. Five levels of the decision tree are shown: 302, 304, 306, 308, and 310. Although five levels are shown, it should be understood that a decision tree that decodes N bits should have N+1 levels. Each of up to four surviving decoding paths is extended by one bit at each level after the root level 304. Leaf or child nodes of a root node 320 represent options for a first bit, and subsequent leaf nodes represent options for subsequent bits. For example, a decoding path from the root node 320 to a leaf node 330*a* represents an estimated codeword bit sequence: 0, 1, 0, 0. At the level 308, a quantity of paths is greater than L. Therefore, L paths with highest likelihood (the best path metric (path metric, PM)) are identified, and remaining paths are discarded. In FIG. 3, surviving decoding paths after path sorting and pruning at the level 306 are shown in bold. Similarly, at the level 310, a quantity of paths is also greater than L. Therefore, L paths with highest likelihood (the best PM) are identified, and remaining paths are also discarded. In the illustrated example, paths terminating at leaf nodes 330*a*, 330*b*, 330*c*, and 330*d* represent paths with highest likelihood. Paths terminating at leaf nodes 340*a*, 340*b*, 340*c*, and 340*d* are discarded paths with lower likelihood.

The following briefly describes an application field and a system architecture to which solutions provided in embodiments described herein are applicable.

Technical solutions in embodiments described herein are applied to various fields in which polar encoding is used, for example, the field of data storage, the field of optical network communication, and the field of wireless communication. A wireless communication system to which embodiments described herein are applicable includes, but is not limited to, a long term evolution (long term evolution, LTE) system, a 5G mobile communication system, an LTE and 5G hybrid networking system, and a future communication network system. Certainly, the wireless communication system is also a non-cellular communication system, for example, Wi-Fi. This is not limited in embodiments described herein. A scenario to which embodiments described herein are applicable includes, but is not limited to, a communication scenario such as enhanced mobile broadband (enhanced mobile broadband, eMBB), ultra-reliable low-latency communication (ultra reliable low latency communication, URLLC), machine-type communication (machine type communication, MTC), massive machine-type communications (massive machine type communications, mMTC), device-to-device (device-to-device, D2D), the Internet of Vehicles (vehicle to everything, NR V2X), and the Internet of Things (Internet of Things, IoT). Specifically, because embodiments described herein are applicable to a communication scenario with a long code length, and in particular, to a service scenario with a large throughput, for example, a high-definition video service, a large file transfer service, a multimedia service such as virtual reality (virtual reality, VR)/augmented reality (augmented reality, AR), or a service such as an automatic hybrid repeat request (hybrid automatic repeat request, HARQ) of wireless communication.

Figure 4:
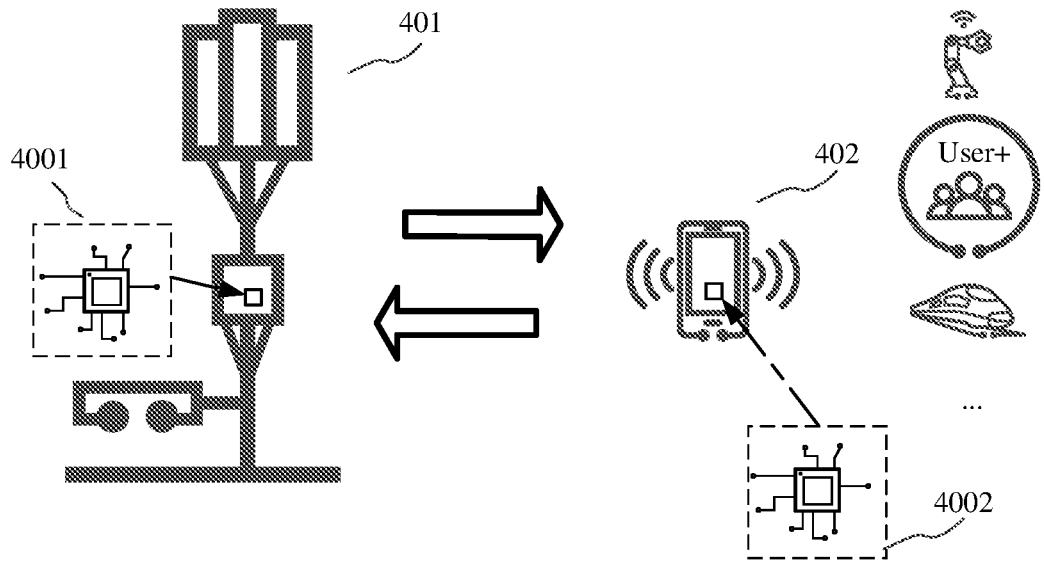
FIG. 4 is a schematic diagram of an architecture of a communication system according to at least one embodiment.

FIG. 4 is a diagram of an architecture of a communication system according to at least one embodiment. Referring to FIG. 4, at least a sending device and a receiving device are included. Optionally, in response to the sending device being a terminal device 402, the receiving device is a network device 401. In response to the sending device being the network device 401, the receiving device is the terminal device 402. The terminal device 402 communicates with the network device 401 through a wireless or wired uplink (uplink, UL) or downlink (downlink, DL). For example, feasibly, the terminal device sends uplink data to the network device in a UL direction through an uplink physical shared channel (physical uplink shared channel, PUSCH). The network device sends downlink data to the terminal device in a DL direction through a physical downlink shared channel (physical downlink shared channel, PDSCH). For example, in response to the sending device being the network device 401, in response to the receiving device being the terminal device 402, the sending device includes an encoder 4001, so that the sending device performs polar encoding and output an encoded sequence. Generally, the encoded sequence is transmitted to the receiving device through a channel after rate matching, interleaving, and modulation. The receiving device includes a decoder 4002. The receiving device 402 receives a signal sent by the sending device 401, and decode the received signal.

The terminal device is also referred to as user equipment (user equipment, UE), a terminal, or the like. The terminal device is a device with a wireless transceiver function, and is deployed on land, including an indoor device or outdoor device, a handheld device, a wearable device, or an in-vehicle device, or is deployed on water (for example, on a ship), or is deployed in the air (for example, on an airplane, a balloon, or a satellite). The terminal device is a mobile phone (mobile phone), a tablet computer (Pad), a computer with a wireless transceiver function, a virtual reality (Virtual Reality, VR) terminal device, an augmented reality (Augmented Reality, AR) terminal device, a wireless terminal in industrial control (industrial control), a wireless terminal in self-driving (self-driving), a wireless terminal in remote medical (remote medical), a wireless terminal in smart grid (smart grid), a wireless terminal in transportation safety (transportation safety), a wireless terminal in a smart city (smart city), a wireless terminal in a smart home (smart home), or the like. The terminal device is alternatively a terminal device in a future 5G network, a terminal device in a future evolved public land mobile network (public land mobile network, PLMN), or the like. For ease of description, the following uses a terminal device as an example to describe the method in embodiments described herein.

Optionally, terminal devices communicate with each other by using a communication technology such as device to device (device to device, D2D), vehicle-to-everything (vehicle-to-everything, V2X), or machine to machine (machine to machine, M2M). A communication method between terminal devices is not limited in embodiments described herein.

The network device includes, but is not limited to, an evolved NodeB (evolved NodeB, eNB, or eNodeB), a NodeB gNB in a 5G mobile communication system, a transmission reception point (transmission reception point, TRP), a base station in a future mobile communication system such as a sixth communication system, and the like. Alternatively, the network device is a relay station, an access point, an in-vehicle device, a wearable device, a network device in a future evolved public land mobile network (public land mobile network, PLMN), or a base station in a network in which a plurality of technologies are converged or other various other evolved networks.

Optionally, the network device is alternatively an access node, a wireless relay node, a wireless backhaul node, or the like in a wireless local area network (wireless fidelity, Wi-Fi) system. Optionally, the network device is alternatively a radio controller in a cloud radio access network (cloud radio access network, CRAN) scenario.

In embodiments described herein, a chip system includes a chip, or includes a chip and another discrete component.

The following describes in detail a polar code encoding/decoding method provided in embodiments described herein.

Figure 5:
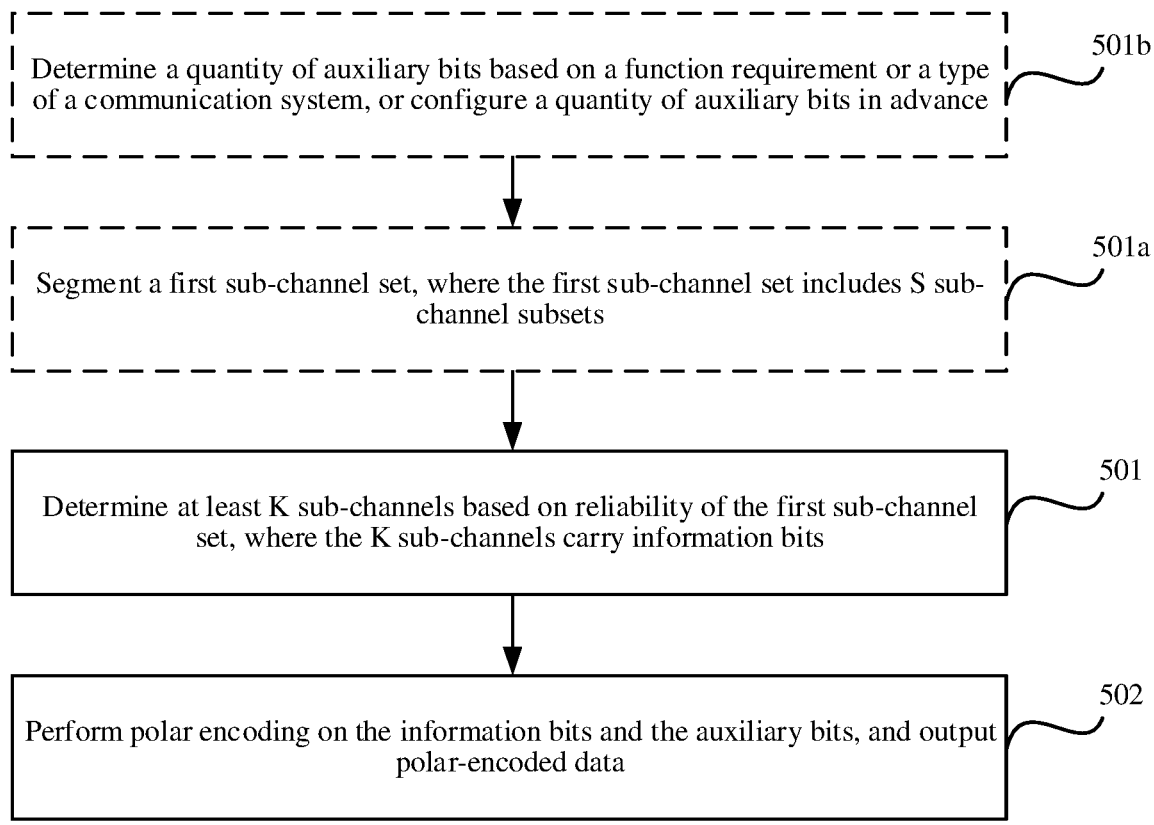
FIG. 5 is a schematic flowchart of a communication method for polar encoding according to at least one embodiment.

Based on the foregoing wireless communication network scenario, FIG. 5 shows a communication method for polar code encoding according to at least one embodiment. At least one embodiment provides a solution for determining an auxiliary bit of a polar code that is different from the existing solution, to improve decoding accuracy and reduce implementation complexity. Specific steps are as follows:

Step 501: Determine at least K sub-channels based on reliability of a first sub-channel set, where the K sub-channels carry information bits.

S sub-channel subsets are determined based on the first sub-channel set, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers.

Step 502: Perform polar encoding on the information bits and the auxiliary bits, and output polar-encoded data.

The method further includes obtaining the information bits. Optionally, the information bits is obtained before the at least K sub-channels are determined based on the reliability of the first sub-channel set.

Optionally, the first sub-channel set is a channel set from which a shorten sub-channel is excluded. Specifically, a channel affected by rate matching, for example, shortening, is excluded from a given channel set to obtain the first sub-channel set. The given channel set is a channel set with a mother code length of polar code encoding. A sub-channel herein refers to a specific channel. In some cases, a sub-channel and a channel express a same or similar meaning, and are not distinguished.

Optionally, in a specific embodiment, the determining at least K sub-channels based on reliability of a first sub-channel set includes: determining (K+J) sub-channels based on the reliability of the first sub-channel set, where the J sub-channels carry auxiliary bits. To be specific, in this case, not only the K sub-channels are determined, but also the J sub-channels carrying auxiliary bits are determined, where J is a positive integer. Preferably, the selected (K+J) sub-channels are (K+J) sub-channels with highest reliability in the first sub-channel set. It should be noted that the first sub-channel set is the foregoing channel set from which a shorten sub-channel is excluded, or is a channel set for which impact of rate matching, such as shortening, is not considered. Optionally, all the Ki sub-channels in the $i^{th}$ sub-channel subset carries information bits. Certainly, a sub-channel or some sub-channels in the Ki sub-channels in a sub-channel subset or some sub-channel subsets alternatively carries a frozen bit or a pre-frozen bit. A remaining sub-channel carries the information bits. A reason of this is that after rate matching, such a phenomenon occurs in the sub-channel subset or the some sub-channel subsets because sorting based on reliability is changed to sorting based on natural sequence numbers.

Optionally, in a specific embodiment, (Ki+Ji) sub-channels are determined based on reliability of the $i^{th}$ sub-channel subset, where the (Ki+Ji) sub-channels carry information bits and the auxiliary bits. Specifically, reliability of the (Ki+Ji) sub-channels is higher than reliability of a remaining sub-channel in the $i^{th}$ sub-channel subset.

Optionally, in a specific embodiment, the determining at least K sub-channels based on reliability of a first sub-channel set is specifically: determining the K sub-channels based on the reliability of the first sub-channel set. To be specific, the determined quantity of sub-channels is K. Optionally, in the $i^{th}$ sub-channel subset of the S sub-channel subsets, sequence numbers of the Ji sub-channels are greater than a sequence number of a remaining sub-channel in the $i^{th}$ sub-channel subset. More specifically, the Ki sub-channels are determined based on reliability of a third sub-channel set. The third sub-channel set is the $i^{th}$ sub-channel subset from which the Ji sub-channels are excluded. The Ki sub-channels carry the information bits. Preferably, reliability of the Ki sub-channels is higher than reliability of a remaining sub-channel in the third sub-channel set.

Optionally, before step 501, step 501*a* is further added: segmenting the first sub-channel set, where the first sub-channel set includes the S sub-channel subsets. Specifically, the first sub-channel set is segmented into the S sub-channel subsets, or includes more than S sub-channel subsets. In polar code encoding, frozen bits are usually not discussed because the frozen bits do not carry payload information, but are included in the first sub-channel set; therefore, is used as a sub-channel subset. The first sub-channel set includes at least S+1 sub-channel subsets. Certainly, for some considerations (for example, pre-freezing), there is other division of sub-channel subsets, and a quantity of obtained sub-channel subsets change based on the division.

Optionally, a sub-channel or some sub-channels of the K sub-channels carry a pre-frozen bit.

With regard to a value of an auxiliary bit, it is assumed that a total of J auxiliary bits are for non-system auxiliary bits (for error detection/correction), and that a receive end and a transmit end uses an agreed redundancy constant (Redundancy Constant, RC), or it is considered to use a parity check PC bit as the auxiliary bit. In this case, the value of the auxiliary bit depends on a parity check polynomial (polynomial). Alternatively, it is considered to use a cyclic redundancy check CRC bit as an extension of this embodiment. Similarly, the value of the auxiliary bit depends on a CRC polynomial (polynomial). In the first case, preferably, the value of the auxiliary bit is 0 or 1. Specifically, in response to there being a 4-bit auxiliary bit, a value of the auxiliary bit is determined by 0 or 1. Optionally, the value of the auxiliary bit is not all 0 or is not all 1, values, such as 0001, 0101, 0110, 0111, and 1010, all fall within the scope of embodiments described herein. Alternatively, a value of the auxiliary bit is determined based on a part or all of a terminal identifier UE-ID, or a value of the auxiliary bit is determined based on a part or all of a base station identifier BS-ID. Alternatively, a value of the auxiliary bit is determined based on a part or all of the terminal identifier UE-ID and a part or all of the base station identifier BS-ID.

Optionally, before step 501, step 501*b* is further added: determining, based on a function requirement or a type of the communication system, a quantity of non-system auxiliary bits, that is, a quantity of the auxiliary bits described in this embodiment. Certainly, in terms of quantity design, a quantity of auxiliary bits is directly given in the communication system, to facilitate engineering implementation. Therefore, determining a total quantity of auxiliary bits is able to not be used during implementation. In a design of this embodiment, generally, a total quantity J of the auxiliary bits is determined based on a quantity T of times of checking a check result of the auxiliary bits during polar decoding, and T is a positive integer. The list size L during decoding is mentioned above. Generally, in response to T being less than or equal to L, false alarm rate performance of the code is better in response to T being set to a smaller value. Specifically, in a specific case or some cases, the total quantity J of the auxiliary bits is greater than or equal to $\log_2(T)$. Alternatively, the total quantity J of the auxiliary bits is greater than or equal to $\log_2(T*CN)$, and CN is a quantity of candidate locations that are to be blindly detected. Alternatively, the total quantity J of the auxiliary bits is greater than or equal to $\Sigma_{i \in S}(\log(T_i)+C_i)$, and $C_i$ is an integer. Alternatively, the total quantity J of the auxiliary bits is a nonnegative integer power of 2. More specifically, in a communication system that does not use blind detection, the total quantity J of the auxiliary bits is greater than or equal to $\log_2(T)$, for example, $J=\log_2(T)+C$, and C is a constant. Alternatively, in a communication system that uses blind detection, the total quantity J of the auxiliary bits is greater than or equal to $\log_2(T*CN)$, for example, $J=\log_2(T*CN)+C$, C is a constant, and CN is a quantity of candidate locations that are to be blindly detected, that is, a quantity of candidate combinations of locations and code lengths/code rates that are to be blindly detected on a channel in the communication system, for example, a maximum quantity of the candidate combinations. Alternatively, in an asymmetric block-combined (Asymmetric Block-combined, ABC) polar code communication system, the total quantity J of the auxiliary bits is greater than or equal to $\Sigma_{i \in S}(\log(T_i)+C_i)$, for example $J=\Sigma_{i \in S}(\log(T_i)+C_i)$, and $C_i$ is a constant. For an ABC polar code, auxiliary bits is inserted at specific locations, to divide the entire polar code into S blocks. All the blocks is different in terms of $T_i$ and $C_i$. Alternatively, in a communication system with low power consumption, the total quantity J of the auxiliary bits is a nonnegative integer power of 2. For example, in response to the auxiliary bit being an RC bit, to accelerate convergence of a flip-SC decoder, J is rounded up or down to $2^x$ to obtain J', where x is 0 or a positive integer. To be specific, a value closest to J is selected from [2, 4, 8, 16 . . . ], that is, J is rounded down or J is rounded up to a specific number in [2, 4, 8, 16 . . . ]. Certainly, there are many rounding manners, and J is rounded in a common round-off manner, and only a non-negative integer is taken as a result. It is understood that the specific quantity J of auxiliary bits determined based on the foregoing formula shall also fall within the protection scope of embodiments described herein, and is not listed one by one again. The foregoing methods for determining quantities in different scenarios is used with reference to each other, or are interchangeable. For example, in a communication system without blind detection, the total quantity J of the auxiliary bits is greater than or equal to $\log_2(T*CN)$, or the total quantity J is greater than or equal to $\Sigma_{i \in S}(\log(T_i) + C_i)$. From a perspective of simplified engineering implementation, a method for determining a quantity J of auxiliary bits is used for compatibility with a plurality of different scenarios. For example, the total quantity J is a nonnegative integer power of 2.

Optionally, C in the foregoing formula is a integer constant, and has a value such as ±0, ±1, ±2, ±3, ±4, ±5, ±6, ±7, ±8, ±9, ±10, ±11, ±12, ±13, ±14, ±15, ±16, . . . .

The following continues to describe and explain the technical solutions of embodiments described herein by using specific examples.

Figure 6:
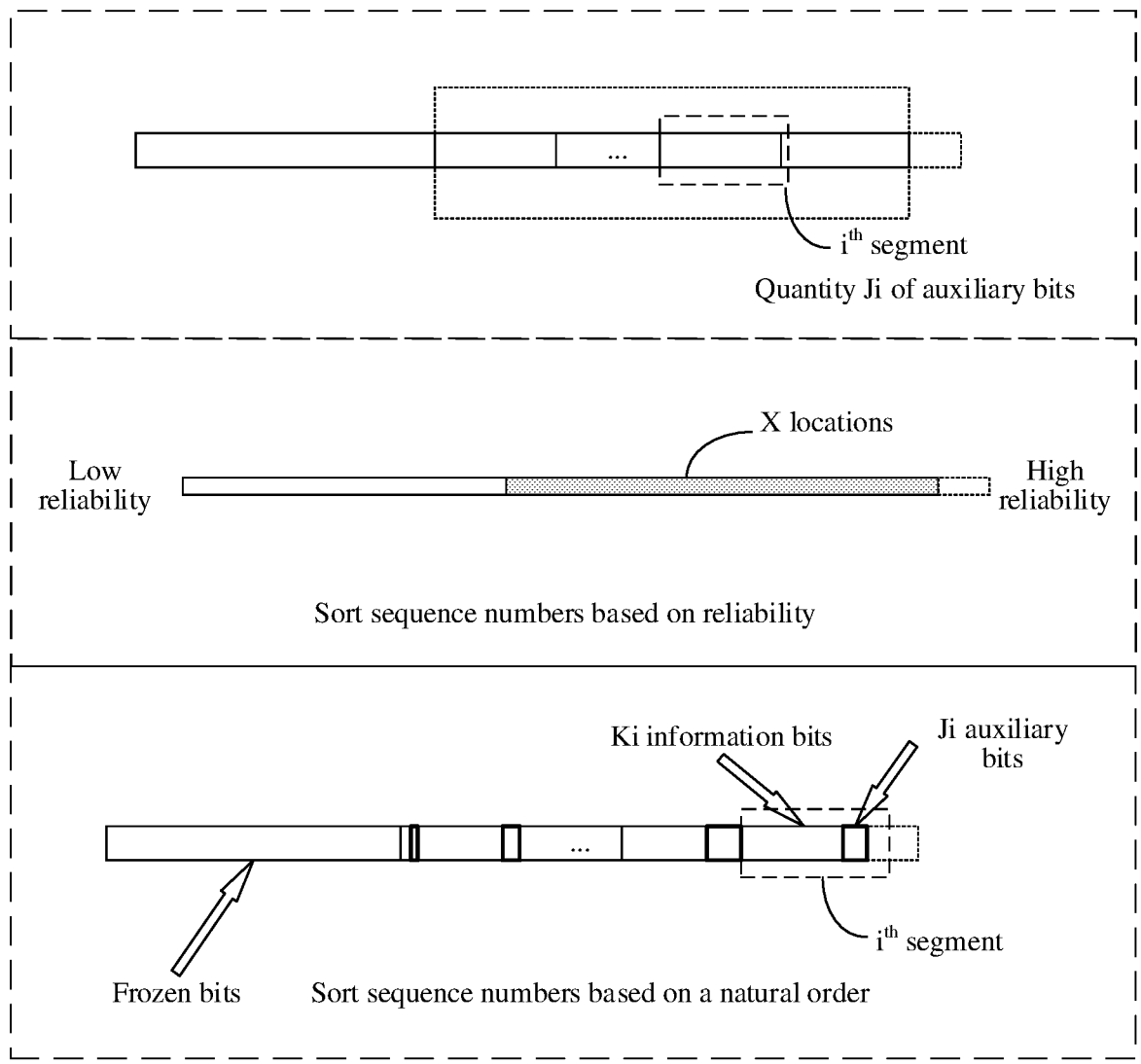
FIG. 6 is a schematic diagram of an encoding procedure of polar encoding in at least one embodiment.

As shown in FIG. 6, in an example, the total quantity J of the auxiliary bits and the quantity S of segments of the sub-channel set are learned, to determine quantities $J_1$, $J_2$, . . . , $J_s$ of auxiliary bits of all the segments. In at least one embodiment, there is S+1 segments, and an extra segment is a sub-channel set for placing frozen bits. In at least one embodiment, there are alternatively S+2 segments, one extra segment is a sub-channel set for placing frozen bits, and the other extra segment is a rate-matched sub-channel set. Other cases are not listed one by one. the method in embodiments described herein focus on sub-channel segments to which auxiliary bits are added. Therefore, division into S segments is used as an example for description. A quantity of segments is related to a segmented sub-channel set, and it should not be understood that a quantity of segments is strictly limited, which is also applicable to the following examples. Details are not described again. In addition, the quantity J of auxiliary bits and the values is determined by referring to the foregoing method.

X (or represented as K+J) sub-channel locations are selected in descending order of reliability in a given sub-channel set for placing auxiliary bits and information bits. The given sub-channel set is a set of sub-channel locations from which rate matching (for example, shortening or puncturing) or impact of rate matching has been excluded or is a sub-channel set with a length of a mother code of the polar code.

Then, the selected X locations are allocated to S segments based on physical addresses (or sequence numbers of the sub-channel) of the selected sub-channel locations, where quantities of sub-channels in all the segments are $X_1$, $X_2$, . . . , $X_s$, quantities of auxiliary bits in all the segments are $J_1$, $J_2$, . . . , $J_s$, and quantities of information bits in all the segments are $X_1-J_1$, $X_2-J_2$, . . . , $X_s-J_s$. In at least one embodiment, in response to $X_i$ being less than or equal to $J_i$, no information bit is allocated to the segment (the $i^{th}$ segment). In at least one embodiment, the quantity S of segments in non-ABC-Polar is 1. Finally, information bits and auxiliary bits are placed in each segment based on a sequence of physical addresses (or sequence numbers of sub-channels), and the information bits are placed before the auxiliary bits.

Referring to the processing process shown in FIG. 6, in at least one embodiment, the total quantity J of the auxiliary bits and the quantity S of segments are learned, to determine quantities $J_1$, $J_2$, . . . , $J_s$ of auxiliary bits of all the segments. The quantity J of auxiliary bits and the values is determined by referring to the foregoing method, and details are not described again. K sub-channel locations are selected in descending order of reliability in a given sub-channel set for placing information bits. The given sub-channel set is a set of sub-channel locations from which rate matching (for example, shortening or puncturing) or impact of rate matching has been excluded or is a sub-channel set with a length of a mother code of the polar code. Then, in at least one embodiment, information bit locations are determined in each segment based on the selected K sub-channel locations, and a quantity of sub-channels in which information bits are determined to be placed in each segment is counted. In response to a quantity $K_i$ of information bit locations selected in a segment plus a quantity $J_i$ of auxiliary bits allocated to the segment being equal to a preset length $X_i$ of the segment, other unselected locations in the segment are frozen, or are for placing frozen bits (a quantity of which is equal to the quantity of auxiliary bits of the segment). The selected K locations are allocated to the S segments based on physical addresses (or sequence numbers of sub-channels) of selected sub-channel locations. Quantities of information bits in all the segments are $K_1$, $K_2$, . . . , $K_s$, and quantities of auxiliary bits in all the segments are $J_1$, $J_2$, . . . , $J_s$. In at least one embodiment, the quantity S of segments in non-ABC-Polar is 1.

$K_i+J_i$ sub-channel locations are selected from a sub-channel set of each segment in descending order of reliability, for placing information bits and auxiliary bits. The sub-channel set of the segment comes from the foregoing given sub-channel set. To be specific, a sub-channel set of each segment is a set of sub-channel locations from which rate matching (for example, shortening or puncturing) or impact of rate matching has been excluded. Finally, the information bits and the auxiliary bits are placed in $K_i+J_i$ sub-channel locations in each segment based on a sequence of physical addresses (or in ascending order of sequence numbers of sub-channels), and the information bits are placed at first locations in the $K_i+J_i$ sub-channel locations, and the auxiliary bits are placed at last locations in the $K_i+J_i$ sub-channel locations.

Similarly, referring to the processing process shown in FIG. 6, in at least one embodiment, the total quantity J of the auxiliary bits and the quantity S of segments are learned, to determine quantities $J_1$, $J_2$, . . . , $J_s$ of auxiliary bits of all the segments. The quantity J of auxiliary bits and the values is determined by referring to the foregoing method, and details are not described again. K sub-channel locations are selected in descending order of reliability in a given sub-channel set. The given sub-channel set is a set of sub-channel locations from which rate matching (for example, shortening or puncturing) or impact of rate matching has been excluded or is a sub-channel set with a length of a mother code of the polar code. Then, in at least one embodiment, a quantity of information bits is determined in each segment based on the selected K sub-channel locations, and a quantity of sub-channels in which information bits are determined to be placed in each segment is counted. In response to a quantity $K_i$ of information bit locations selected in a segment plus a quantity $J_i$ of auxiliary bits allocated to the segment being equal to a preset length $X_i$ of the segment, other unselected locations in the segment are frozen, or are for placing frozen bits, a quantity of which is equal to the quantity of auxiliary bits of the segment. The selected K locations are allocated to the S segments based on physical addresses (or sequence numbers of sub-channels) of selected sub-channel locations. Quantities of information bits in all the segments are $K_1$, $K_2, \ldots, K_s$, and quantities of auxiliary bits in all the segments are $J_1, J_2, \ldots, J_s$. In at least one embodiment, the quantity S of segments in non-ABC-Polar is 1.

$J_i$ sub-channel locations are selected from a sub-channel set of each segment in descending order of physical locations of the sub-channels (or in descending order of natural sequence numbers of the sub-channels), for placing auxiliary bits. The sub-channel set of the segment comes from the foregoing given sub-channel set. To be specific, a sub-channel set of each segment is a set of sub-channel locations from which rate matching (for example, shortening or puncturing) or impact of rate matching has been excluded. Then, $K_i$ sub-channel locations are selected in descending order of reliability from the sub-channel set of each segment from which the $J_i$ locations that have been selected are excluded. The information bits are padded at the information bit locations, and the auxiliary bits are padded at auxiliary bit locations. From a perspective of a physical location relationship, sequence numbers of sub-channels for placing the auxiliary bits are after sequence numbers of sub-channels for placing the information bits.

Figure 7A:
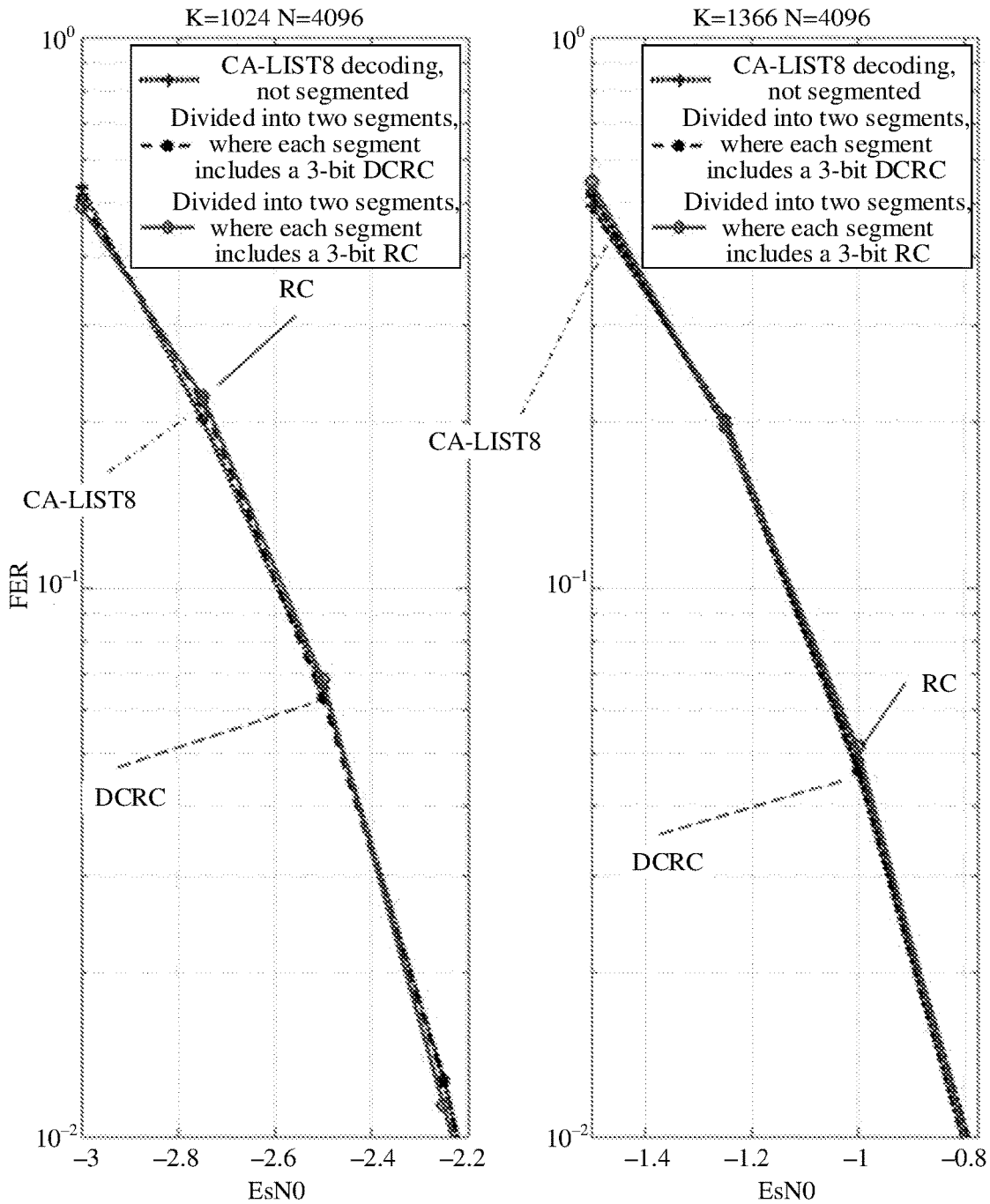
FIG. 7A and FIG. 7B are a simulation diagram of FER performance of three polar codes under conditions such as different quantities K of information bits and a same code length N.
Figure 7B:
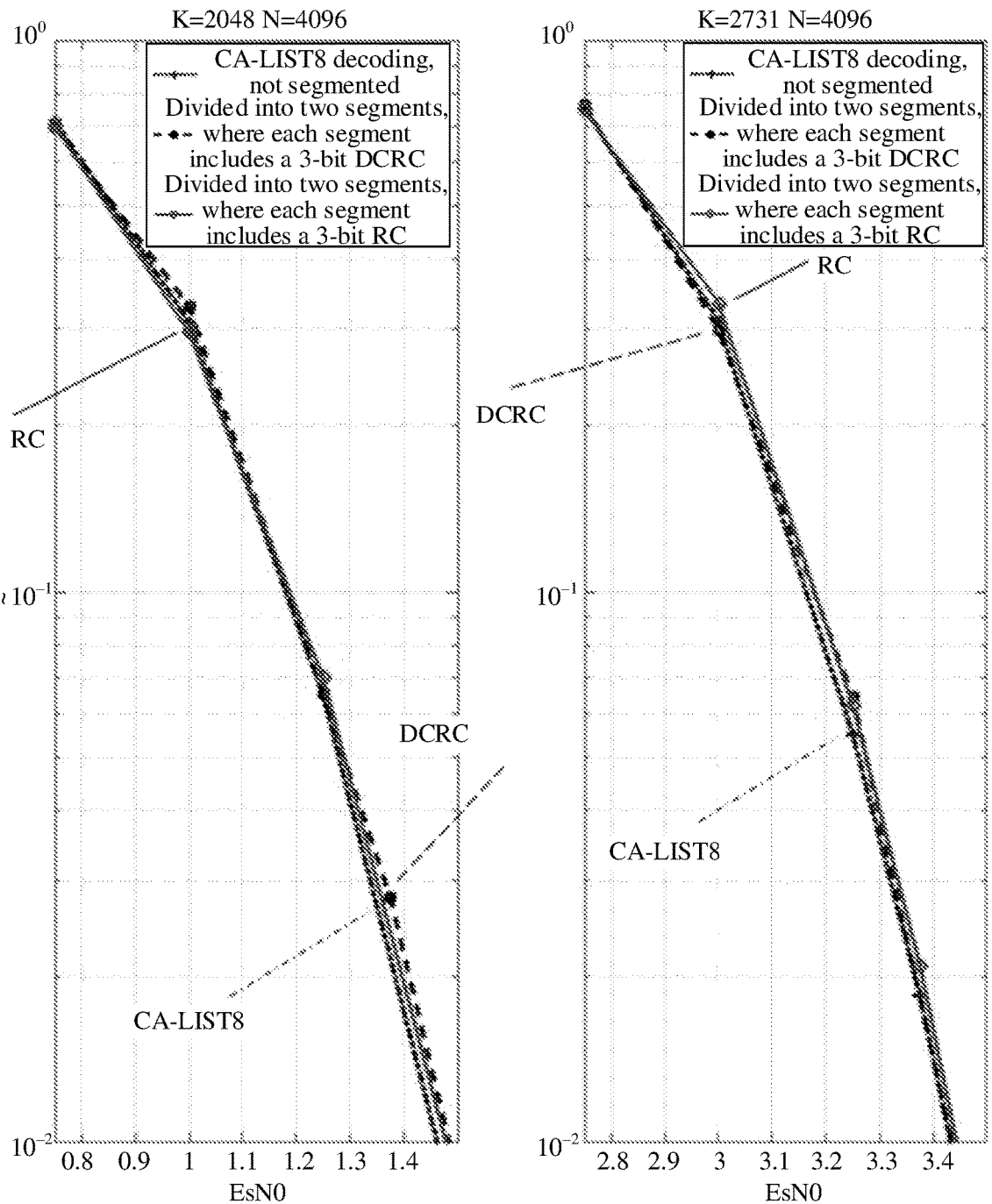
Figure 8:
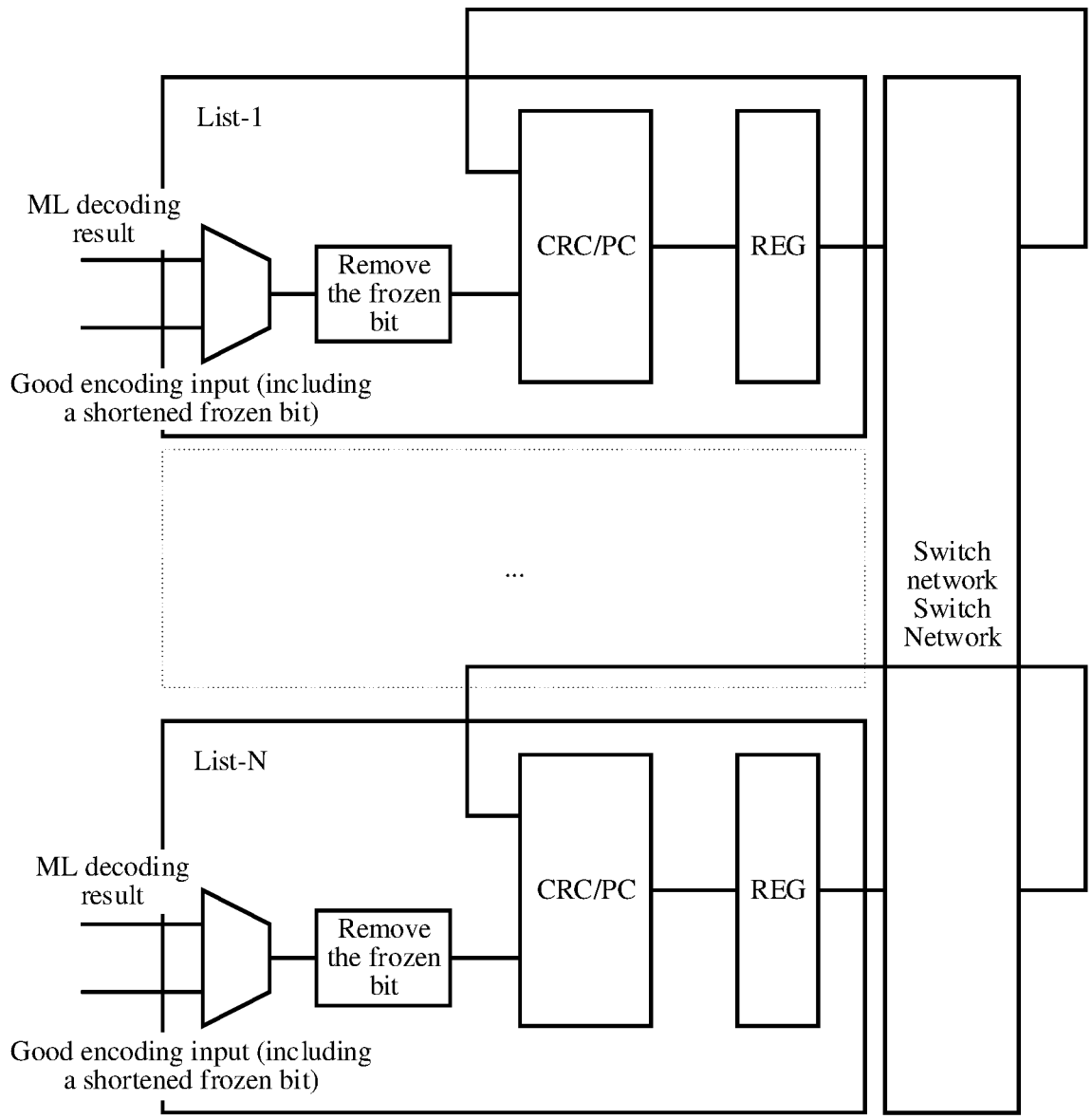
FIG. 8 is a schematic diagram of an auxiliary-bit calculation circuit commonly used in an existing LIST decoder.

FIG. 7A and FIG. 7B show FER performance of three polar codes under conditions such as different quantities K of information bits and a same code length N. A CA-LIST8 curve represents performance of a polar code that is not segmented, and no extra auxiliary bit is added to the code, where L=8. A DCRC curve represents performance of a polar code to which six CRC auxiliary bits are added (based on the polar code of CA-LIST8). The code is divided into two segments, and each segment includes a 3-bit distributed CRC. An RC curve represents performance of a polar code to which six redundancy constant RC auxiliary bits are added (based on the polar code of CA-LIST8). The code is divided into two segments, each segment includes a 3-bit RC, and the redundancy constant is padded with a signal 0. Based on simulation results, the three are very close in terms of FER performance, and there is no significant difference in a simulation range. In general, under specific conditions, using a J-bit redundancy constant RC or a parity check PC bit+X systematic cyclic redundancy check CRC bits and using a (J+X)-bit CRC bit achieves same or similar effects in terms of false alarm rate FAR performance and frame error rate FER performance. FIG. 8 is a schematic diagram of an auxiliary-bit calculation circuit commonly used in an existing LIST decoder. After at least one embodiment is used, complexity of a decoder is effectively reduced, overheads caused by auxiliary bit calculation is reduced, and area overheads of the decoder is reduced. In a solution in which a redundant constant RC is used, area overheads is reduced by about 5% to 10% for the decoder. In response to a PC bit being used as the auxiliary bit in the solution, the PC bit is used for self-checking of a decoding result. Generally, calculation difficulty of the PC bit is lower than that of a CRC bit. A frozen-bit removing module in the figure is excluded. In response to CRC calculation being switched to PC calculation, overheads of the decoder is reduced by about 2%. In a specific application scenario, decoding overheads are reduced in the embodiments described herein, but good beneficial effects are achieved without sacrificing code performance.

Based on the communication method disclosed above, as shown in FIG. 9, embodiments described herein further provide a communication apparatus 900 for polar encoding. The communication apparatus 900 is configured to perform the communication method disclosed above and the method described in at least one embodiment. The communication apparatus 900 includes a processing module 901 and an encoding module 902.

The processing module 901 is configured to determine at least K sub-channels based on reliability of a first sub-channel set, where the K sub-channels carry information bits.

The encoding module 902 is configured to perform polar encoding on the information bits and auxiliary bits, and output polar-encoded data.

S sub-channel subsets are determined based on the first sub-channel set, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers.

Optionally, the first sub-channel set is a channel set from which a shorten sub-channel is excluded. Specifically, a channel affected by rate matching, for example, shortening, is excluded from a given channel set to obtain the first sub-channel set. The given channel set is a channel set with a mother code length of polar code encoding. A sub-channel herein refers to a specific channel. In some cases, a sub-channel and a channel express a same or similar meaning, and are not distinguished.

Optionally, in a specific embodiment, the processing module 901 is further configured to determine (K+J) sub-channels based on the reliability of the first sub-channel set, where the J sub-channels carry auxiliary bits. To be specific, in this case, not only the K sub-channels are determined, but also the J sub-channels carrying auxiliary bits are determined, where J is a positive integer. Preferably, the selected (K+J) sub-channels are (K+J) sub-channels with highest reliability in the first sub-channel set. The first sub-channel set is the foregoing channel set from which a shorten sub-channel is excluded, or is a channel set for which impact of rate matching, such as shortening, is not considered. Optionally, all the Ki sub-channels in the $i^{th}$ sub-channel subset carries information bits. Certainly, a sub-channel or some sub-channels in the Ki sub-channels in sub-channel subset or some sub-channel subsets alternatively carries a frozen bit or a pre-frozen bit. A remaining sub-channel carries the information bits. A reason of this is that after rate matching, such a phenomenon occurs in the sub-channel subset or the some sub-channel subsets because sorting based on reliability is changed to sorting based on natural sequence numbers.

Optionally, in a specific embodiment, the processing module 901 is further configured to determine (Ki+Ji) sub-channels based on reliability of the $i^{th}$ sub-channel subset, where the (Ki+Ji) sub-channels carry information bits and the auxiliary bits. Specifically, reliability of the (Ki+Ji) sub-channels is higher than reliability of a remaining sub-channel in the $i^{th}$ sub-channel subset.

Optionally, in a specific embodiment, the processing module 901 is further configured to determine the K sub-channels based on the reliability of the first sub-channel set. To be specific, the determined quantity of sub-channels is K. Optionally, in the $i^{th}$ sub-channel subset of the S sub-channel subsets, sequence numbers of the Ji sub-channels are greater than a sequence number of a remaining sub-channel in the $i^{th}$ sub-channel subset. More specifically, the Ki sub-channels are determined based on reliability of a third sub-channel set. The third sub-channel set is the $i^{th}$ sub-channel subset from which the Ji sub-channels are excluded. The Ki sub-channels carry the information bits. Preferably, reliability of the Ki sub-channels is higher than reliability of a remaining sub-channel in the third sub-channel set.

Optionally, the communication apparatus 900 further includes a segmenting module 903, configured to segment the first sub-channel set, where the first sub-channel set includes the S sub-channel subsets. Specifically, the first sub-channel set is segmented into the S sub-channel subsets, or includes more than S sub-channel subsets. It is easy to understand that in polar code encoding, frozen bits are usually not discussed because the frozen bits do not carry payload information, but are included in the first sub-channel set, and therefore, is used as a sub-channel subset. The first sub-channel set includes at least S+1 sub-channel subsets. Certainly, for some considerations (for example, pre-freezing), there is other division of sub-channel subsets, and a quantity of obtained sub-channel subsets changes based on the division.

Optionally, a sub-channel or some sub-channels of the K sub-channels carry a pre-frozen bit.

With regard to a value of an auxiliary bit, assuming that a total of J auxiliary bits are used for non-system auxiliary bits (used for error detection/correction), and a receive end and a transmit end use an agreed redundancy constant (Redundancy Constant, RC). Alternatively, it is considered to use a parity check PC bit as the auxiliary bit. In this way, the value of the auxiliary bit depends on a parity check polynomial (polynomial). Alternatively, it is considered to use a cyclic redundancy check CRC bit as an extension of this embodiment. Similarly, the value of the auxiliary bit depends on a CRC polynomial (polynomial). In the first case, preferably, a value of the auxiliary bit is 0 or 1. Alternatively, a value of the auxiliary bit is determined based on a part or all of a terminal identifier UE-ID, or a value of the auxiliary bit is determined based on a part or all of a base station identifier BS-ID. Alternatively, a value of the auxiliary bit is determined based on a part or all of the terminal identifier UE-ID and a part or all of the base station identifier BS-ID.

Optionally, the communication apparatus 900 further includes an input module 904. On the one hand, the input module 904 is configured to obtain information bits. Optionally, the input module 904 obtains the information bits before the at least K sub-channels are determined based on the reliability of the first sub-channel set. On the other hand, the input module 904 is configured to obtain a quantity of auxiliary bits, for example, determine a quantity of non-system auxiliary bits based on a function requirement or a type of the communication system, that is, the quantity of auxiliary bits in this embodiment. Certainly, in terms of quantity design, the input module 904 directly obtains the quantity of auxiliary bits, to facilitate engineering implementation. Therefore, determining a total quantity of auxiliary bits is not used during implementation. Alternatively, the quantity of auxiliary bits is determined through the processing module 901. In at least one embodiment, the quantity of auxiliary bits is preset in the processing module 901. In a design of this embodiment, generally, a total quantity J of the auxiliary bits is determined based on a quantity T of times of checking a check result of the auxiliary bits during polar decoding, and T is a positive integer. A list size L during decoding is mentioned above.

Generally, in response to T being less than or equal to L, false alarm rate performance of the code is better in response to T being set to a smaller value. Specifically, in a specific case or some cases, the total quantity J of the auxiliary bits is greater than or equal to $\log_2(T)$. Alternatively, the total quantity J of the auxiliary bits is greater than or equal to $\log_2(T*CN)$, and CN is a quantity of candidate locations that are used to be blindly detected. Alternatively, the total quantity J of the auxiliary bits is greater than or equal to $\Sigma_{i \in S}(\log(T_i)+C_i)$, and $C_i$ is an integer. Alternatively, the total quantity J of the auxiliary bits is a nonnegative integer power of 2. More specifically, in a communication system that does not use blind detection, the total quantity J of the auxiliary bits is greater than or equal to $\log_2(T)$, for example, $J=\log_2(T)+C$, and C is a constant. Alternatively, in a communication system that uses blind detection, the total quantity J of the auxiliary bits is greater than or equal to $\log_2(T*CN)$, for example, $J=\log_2(T*CN)+C$, C is a constant, and CN is a quantity of candidate locations that are to be blindly detected, that is, a quantity of candidate combinations of locations and code lengths/code rates that are to be blindly detected on a channel in the communication system, for example, a maximum quantity of the candidate combinations. Alternatively, in an asymmetric block-combined (Asymmetric Block-combined, ABC) polar code communication system, the total quantity J of the auxiliary bits is greater than or equal to $\Sigma_{i \in S}(\log(T_i)+C_i)$, for example $J=\Sigma_{i \in S}(\log(T_i)+C_i)$, and $C_i$ is a constant. For an ABC polar code, auxiliary bits is inserted at specific locations, to divide the entire polar code into S blocks. All the blocks is different in terms of $T_i$ and $C_i$. Alternatively, in a communication system with low power consumption, the total quantity J of the auxiliary bits is a nonnegative integer power of 2. For example, in response to the auxiliary bit being an RC, to accelerate convergence of a flip-SC decoder, J is rounded up or down to $2^x$ to obtain J', where x is 0 or a positive integer. To be specific, a value closest to J is selected from [2, 4, 8, 16 . . . ], that is, J is rounded down or J is rounded up to a specific number in [2, 4, 8, 16 . . . ]. Certainly, there are many rounding manners, and J is rounded in a common round-off manner, and only a non-negative integer is taken as a result. The specific quantity J of auxiliary bits determined based on the foregoing formula shall also fall within the protection scope of embodiments described herein, and is not listed one by one again. The foregoing methods for determining quantities in different scenarios is used with reference to each other, or are interchangeable. For example, in a communication system without blind detection, the total quantity J of the auxiliary bits is greater than or equal to $\log_2(T*CN)$, or the total quantity J is greater than or equal to $\Sigma_{i \in S}(\log(T_i)+C_i)$. From a perspective of simplified engineering implementation, a method for determining a quantity J of auxiliary bits is used for compatibility with a plurality of different scenarios. For example, the total quantity J is a nonnegative integer power of 2.

Optionally, C in the foregoing formula is a integer constant, and has a value such as ±0, ±1, ±2, ±3, ±4, ±5, ±6, ±7, ±8, ±9, ±10, ±11, ±12, ±13, ±14, ±15, ±16, . . . .

The communication apparatus 900 is further configured to implement the solutions described in the foregoing specific examples. In this case, functions implemented by functional modules of the communication apparatus 900 is learned with reference to the solutions described in the foregoing specific examples and functions of the modules of the communication apparatus 900. Details are not described again.

Based on similar concepts of polar encoding and auxiliary bits determining, as shown in FIG. 10, embodiments described herein further provide a communication method for polar decoding. Embodiments described herein provide a solution for determining an auxiliary bit of a polar code that is different from the existing solution, to improve decoding accuracy and reduce implementation complexity. Specific steps are as follows:

Step 1001: Receive an encoded sequence, where the encoded sequence is obtained by performing polar encoding on a first bit sequence, a first sub-channel set corresponding to the first bit sequence includes at least K sub-channels determined based on reliability of the first sub-channel set, the K sub-channels carry information bits, the first sub-channel set includes S sub-channel subsets, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers.

Step 1002: Perform polar decoding based on the encoded sequence, to obtain the information bits.

Optionally, the first sub-channel set is a channel set from which a shorten sub-channel is excluded. Specifically, a channel affected by rate matching, for example, shortening, is excluded from a given channel set to obtain the first sub-channel set. The given channel set is a channel set with a mother code length of polar code encoding. A sub-channel herein refers to a specific channel. In some cases, a sub-channel and a channel express a same or similar meaning, and are not distinguished.

Optionally, in a specific embodiment, the determining at least K sub-channels based on reliability of a first sub-channel set includes: determining (K+J) sub-channels based on the reliability of the first sub-channel set, where the J sub-channels carry auxiliary bits. To be specific, in this case, not only the K sub-channels are determined, but also the J sub-channels carrying auxiliary bits are determined, where J is a positive integer. Preferably, the selected (K+J) sub-channels are (K+J) sub-channels with highest reliability in the first sub-channel set. The first sub-channel set is the foregoing channel set from which a shorten sub-channel is excluded, or is a channel set for which impact of rate matching, such as shortening, is not considered. Optionally, all the Ki sub-channels in the $i^{th}$ sub-channel subset carries information bits. Certainly, a sub-channel or some sub-channels in the Ki sub-channels in a sub-channel subset or some sub-channel subsets alternatively carries a frozen bit or a pre-frozen bit. A remaining sub-channel carries the information bits. A reason of this is that after rate matching, such a phenomenon occurs in the sub-channel subset or the some sub-channel subsets because sorting based on reliability is changed to sorting based on natural sequence numbers.

Optionally, in a specific embodiment, (Ki+Ji) sub-channels are determined based on reliability of the $i^{th}$ sub-channel subset, where the (Ki+Ji) sub-channels carry information bits and the auxiliary bits. Specifically, reliability of the (Ki+Ji) sub-channels is higher than reliability of a remaining sub-channel in the $i^{th}$ sub-channel subset.

Optionally, in a specific embodiment, determining the at least K sub-channels based on the reliability of the first sub-channel set is specifically: determining the K sub-channels based on the reliability of the first sub-channel set. To be specific, the determined quantity of sub-channels is K. Optionally, in the $i^{th}$ sub-channel subset of the S sub-channel subsets, sequence numbers of the Ji sub-channels are greater than a sequence number of a remaining sub-channel in the $i^{th}$ sub-channel subset. More specifically, the Ki sub-channels are determined based on reliability of a third sub-channel set. The third sub-channel set is the $i^{th}$ sub-channel subset from which the Ji sub-channels are excluded. The Ki sub-channels carry the information bits. Preferably, reliability of the Ki sub-channels is higher than reliability of a remaining sub-channel in the third sub-channel set.

Specifically, the first sub-channel set is segmented into the S sub-channel subsets, or includes more than S sub-channel subsets. It is easy to understand that in polar code encoding, frozen bits are usually not discussed because the frozen bits do not carry payload information, but are included in the sub-channel set, and therefore, is used as a sub-channel subset. The first sub-channel set includes at least S+1 sub-channel subsets. Certainly, for some considerations (for example, pre-freezing), there is other division of sub-channel subsets, and a quantity of obtained sub-channel subsets changes based on the division.

Optionally, a sub-channel or some sub-channels of the K sub-channels carry a pre-frozen bit.

With regard to a value of an auxiliary bit, assuming that a total of J auxiliary bits are used for non-system auxiliary bits (used for error detection/correction), and a receive end and a transmit end use an agreed redundancy constant (Redundancy Constant, RC). Alternatively, a parity check PC bit is able to be used as the auxiliary bit. Optionally, the decoder side determines, based on a function requirement or a type of the communication system, a quantity of non-system auxiliary bits, that is, a quantity of the auxiliary bits described in this embodiment. Certainly, in terms of quantity design, a transmit end and a receive end in the communication system directly agree on a quantity of auxiliary bits, to facilitate engineering implementation. Therefore, determining a total quantity of auxiliary bits is not used during implementation. For a specific method for determining a value of an auxiliary bit and a specific method for calculating a quantity of auxiliary bits, refer to the foregoing descriptions in the polar encoding.

Figure 11:
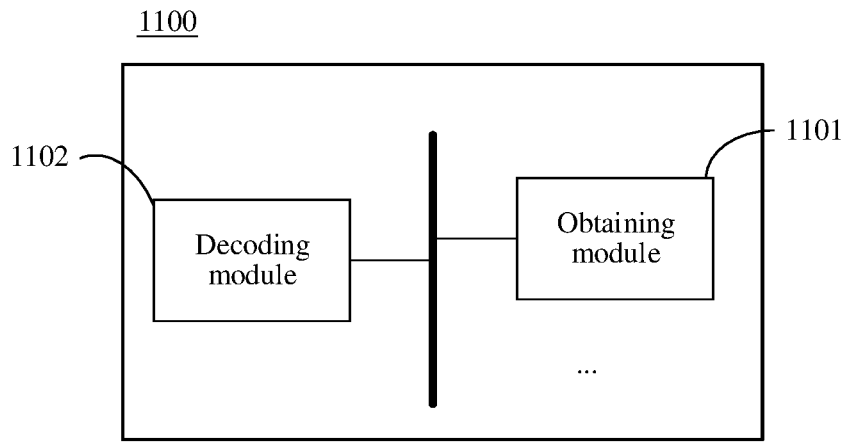
FIG. 11 is a schematic diagram of a communication apparatus 1100 for polar encoding according to at least one embodiment.

Based on the communication method for polar decoding disclosed above, as shown in FIG. 11, embodiments described herein further provide a communication apparatus 1100 for polar decoding. The communication apparatus 1100 is configured to perform the communication method disclosed above and the method described in the at least one embodiment. The communication apparatus 1100 includes an obtaining module 1101 and a decoding module 1102.

The obtaining module 1101 is configured to obtain an encoded sequence, where the encoded sequence is obtained by performing polar encoding on a first bit sequence, a first sub-channel set corresponding to the first bit sequence includes at least K sub-channels determined based on reliability of the first sub-channel set, the K sub-channels carry information bits, the first sub-channel set includes S sub-channel subsets, an $i^{th}$ sub-channel subset in the S sub-channel subsets includes Ji sub-channels carrying auxiliary bits and Ki sub-channels in the K sub-channels, sequence numbers of the Ji sub-channels carrying the auxiliary bits are after sequence numbers of the Ki sub-channels, the auxiliary bits include a known redundancy check RC bit, and K, S, Ji, and Ki are integers.

The decoding module 1102 is configured to perform polar decoding based on the encoded sequence, to obtain the information bits.

Optionally, with regard to a value of an auxiliary bit, assuming that a total of J auxiliary bits are used for non-system auxiliary bits (used for error detection/correction), and a receive end and a transmit end use an agreed redundancy constant (Redundancy Constant, RC), for example, a constant 0. Alternatively, a parity check PC bit as the auxiliary bit. Optionally, the obtaining module 1101 is further configured to determine, based on a function requirement or a type of the communication system, a quantity of non-system auxiliary bits, that is, a quantity of the auxiliary bits described in this embodiment. Certainly, in terms of quantity design, a transmit end and a receive end in the communication system directly agree on a quantity of auxiliary bits, to facilitate engineering implementation. Therefore, determining a total quantity of auxiliary bits is not used during implementation. For a specific method for determining a value of an auxiliary bit and a specific method for calculating a quantity of auxiliary bits, refer to the foregoing descriptions in the polar encoding.

Optionally, for other functions of the communication apparatus 1100 and modules of the communication apparatus 1100, refer to descriptions in specific optional implementations of the foregoing communication method for polar decoding. Details are not described again.

Figure 12:
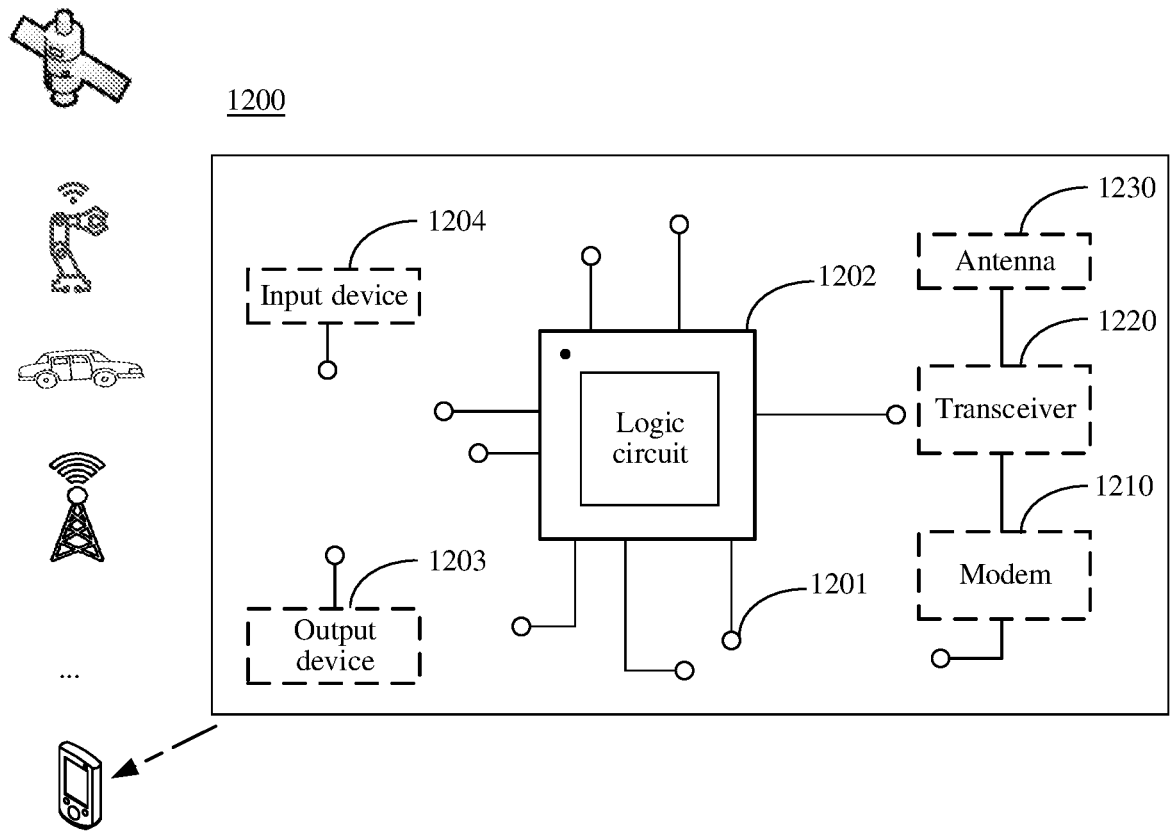
FIG. 12 is a schematic diagram of a polar code communication apparatus 1200 according to at least one embodiment.

Based on same concepts of polar encoding, decoding, and auxiliary bits determining, as shown in FIG. 12, embodiments described herein further provide a polar code communication apparatus 1200. The polar code communication apparatus 1200 is configured to perform the foregoing polar encoding method or polar decoding method, and perform the methods described in specific examples. The method is partially or entirely implemented by hardware, or the method is partially or entirely implemented by software. For example, specifically, the method is implemented by a combination of hardware and software. Optionally, in response to the foregoing method being mainly implemented by hardware, the polar code communication apparatus 1200 includes a communication interface 1201 and a logic circuit 1202. The communication interface 1201 is configured to obtain to-be-coded bits, where the to-be-coded bits include information bits, and the information bits herein is payload (payload) bits, or configured to obtain an encoded sequence, where the encoded sequence is obtained after polar encoding is performed on a first bit sequence. The logic circuit 1202 is configured to perform the foregoing communication method for polar encoding. For details, refer to the descriptions in the foregoing embodiments. The logic circuit 1202 performs functions such as determining at least K sub-channels based on reliability of a first sub-channel set, and performing polar encoding on the information bits and the auxiliary bits. Alternatively, the logic circuit 1202 is configured to perform the foregoing communication method for polar decoding, and perform functions such as performing polar decoding based on an encoded sequence to obtain information bits. The logic circuit 1202 further performs the methods described in the foregoing specific examples. The communication interface 1201 (which is not be the same interface 1201 that implements the foregoing obtaining function) is further configured to output polar-encoded data or output polar-decoded bits.

Further, the encoded data output by the communication apparatus 1200 is modulated by a modulator 1210 and then output to a transceiver 1220. The transceiver 1220 performs corresponding processing (including, but not limited to, digital-to-analog conversion and/or frequency conversion processing) on the modulated sequence, and then send the sequence through an antenna 1230. Correspondingly, during decoding, a signal of an air interface is received through the antenna 1230, and then, transmitted through the transceiver 1220 to a demodulator 1210 for processing. The signal that has been processed by the demodulator 1210 is transmitted to the logic circuit 1202 through the communication interface 1201 for decoding. From a perspective of product integration, in response to some conditions permit, the modulator/demodulator 1210 and the transceiver 1220 is a function implementation module or a physical implementation unit, or the transceiver 1220 and the antenna 1230 is a function implementation module or a physical implementation unit. Similarly, one physical entity is used to implement functions of the modulator and the demodulator. For example, 1210 is also a modulator/demodulator, and the logic circuit 1202 also has a decoding function. Specifically, during specific implementation, the communication apparatus 1200 is a chip or an integrated circuit.

In an optional implementation, the communication apparatus 1200 further includes an output device 1203 and an input device 1204. For example, the input device 1204 is a device such as a (virtual) keyboard, a microphone, or a joystick, and the output device 1203 is a device such as a display screen or a speaker (speaker). A person skilled in the art is able to figure out that the communication apparatus 1200 is a mobile phone, a base station, an automobile, an industrial robot, a satellite, a network server, a desktop computer, a portable computer, a tablet computer, a wireless terminal, an embedded device, a chip system, or a device having a similar structure or circuit in FIG. 12. In addition, the composition structure shown in FIG. 12 does not constitute a limitation on the communication apparatus. In addition to the components shown in FIG. 12, the communication apparatus includes more or fewer components than those shown in the figure, or combine some components, or have different component arrangements.

Figure 13:
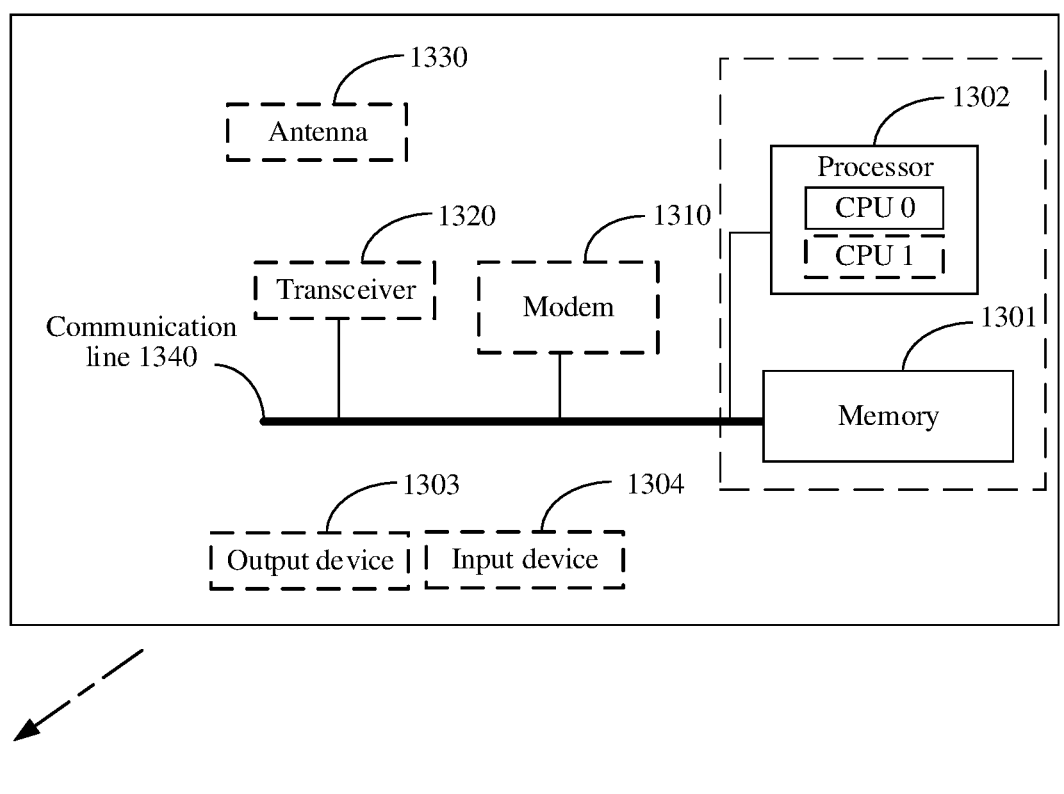
FIG. 13 is a schematic diagram of a polar code communication apparatus 1300 according to at least one embodiment.

Optionally, in response to the foregoing method being partially or entirely implemented by software, as shown in FIG. 13, a polar code communication apparatus 1300 includes a memory 1301 and a processor 1302. The memory 1301 is configured to store a program. The processor 1302 is configured to execute a part or all of the program stored in the memory 1301. In response to the program is executed, the polar code communication apparatus 1300 performs the foregoing polar encoding method or the polar decoding method, and perform the methods described in the specific examples. Optionally, the memory 1301 is a physically independent unit, or as shown in FIG. 13, the memory 1301 and the processor 1302 are integrated together. In an example, the processor 1302 includes one or more processors, for example, a CPU 0 and a CPU 1 in FIG. 13. Optionally, in response to the encoding or decoding method in the foregoing embodiment being partially or entirely implemented by software, the communication apparatus 1300 alternatively includes only the processor 1302. The memory 1301 configured to store the part or all of the program is located outside the polar code communication apparatus 1300. The processor 1302 is connected to the memory 1301 by a communication line (for example, a circuit/bus) 1340, and is configured to read and execute the program stored in the memory 1301. Further, the encoded data output by the communication apparatus 1300 is modulated by a modulator 1310 and then output to a transceiver 1320. The transceiver 1320 performs corresponding processing (including, but not limited to, digital-to-analog conversion and/or frequency conversion processing) on the modulated sequence, and then send the sequence through an antenna 1330. Correspondingly, during decoding, a signal of an air interface is received through the antenna 1230, and then, transmitted through the transceiver 1220 to a demodulator 1210 for processing. The signal that has been processed by the demodulator 1210 is transmitted to the logic circuit 1202 through the communication interface 1201 for decoding. From a perspective of product integration, in response to some conditions permit, the modulator 1310 and the transceiver 1320 is a function implementation module or a physical implementation unit, or the transceiver 1320 and the antenna 1330 is a function implementation module or a physical implementation unit. Similarly, one physical entity is used to implement functions of the modulator and the demodulator. For example, 1310 shown in the figure is also a demodulator, and the processor 1302 also has a decoding function. Specifically, during specific implementation, the communication apparatus 1300 is a chip or an integrated circuit.

In an optional implementation, the communication apparatus 1300 further includes an output device 1303 and an input device 1304. For example, the input device 1304 is a device such as a (virtual) keyboard, a microphone, or a joystick, and the output device 1303 is a device such as a display screen or a speaker (speaker). A person skilled in the art is able to figure out that the communication apparatus 1300 is a mobile phone, a base station, an automobile, an industrial robot, a satellite, a network server, a desktop computer, a portable computer, a tablet computer, a wireless terminal, an embedded device, a chip system, or a device having a similar structure or circuit in FIG. 13. In addition, the composition structure shown in FIG. 13 does not constitute a limitation on the communication apparatus. In addition to the components shown in FIG. 13, the communication apparatus includes more or fewer components than those shown in the figure, or combine some components, or have different component arrangements.

The processor is a central processing unit (central processing unit, CPU), a network processor (network processor, NP), or a combination of a CPU and an NP. The processor further includes a hardware chip. The hardware chip or the logic circuit is an application-specific integrated circuit (application-specific integrated circuit, ASIC), a programmable logic device (programmable logic device, PLD), or a combination thereof. The PLD is a complex programmable logic device (complex programmable logic device, CPLD), a field-programmable gate array (field-programmable gate array, FPGA), a generic logic array (generic logic array, GAL), or any combination thereof. The memory in the foregoing embodiments includes a volatile memory (volatile memory), for example, a random-access memory (random-access memory, RAM). Alternatively, the memory includes a non-volatile memory (non-volatile memory), such as a flash memory (flash memory), a hard disk drive (hard disk drive, HDD), or a solid-state drive (solid-state drive, SSD). Alternatively, the memory includes a combination of the foregoing types of memories.

The transceiver transmits and receives signaling over any type of communication medium. In some embodiments, the transceiver transmits and receives signaling over a wireless medium. For example, the transceiver is a wireless transceiver configured to perform communication based on the following wireless telecommunications protocol: a cellular protocol (for example, Long Term Evolution (Long Term Evolution, LTE)), a wireless local area network (wireless local area network, WLAN) protocol (for example, Wi-Fi), or any other type of wireless protocol (for example, Bluetooth or near-field communication (near-field communication, NFC)). The type of the antenna includes a single antenna, a plurality of separate antennas, or a multi-antenna array for multi-layer communication such as a single-input multiple-output (single-input multiple-output, SIMO), multiple-input single-output (multiple-input-single-output, MISO), or multiple-input multiple-output (multiple-input multiple-output, MIMO). In other embodiments, the transceiver transmits and receives signaling over a wired medium such as twisted pair cables, coaxial cables, or optical fibers. Specific processing systems and/or transceivers is all of the components shown or a subset of the components, and the degrees of integration of the devices is different from each other.

A person skilled in the art should understand that a method, a system, or a computer program product is provided based on embodiments described herein. Therefore, the foregoing embodiments is implemented in an implementation form that is completely hardware, completely software, or a combination of software and hardware aspects. In addition, in at least one embodiment, a form of a computer program product that is implemented on one or more computer-usable storage media (including, but not limited to, a disk memory, a CD-ROM, an optical memory, and the like) that include computer-usable program code is used. Specifically, at least one embodiment provides a computer storage medium, storing a computer program. The computer program is configured to perform the foregoing polar code encoding method, or is further configured to perform the methods including, but not limited to, the methods described in the specific examples, or perform the foregoing polar code decoding method. In addition, at least one embodiment further provides a computer program product including instructions. In response to the computer program product being partially or entirely run on a computer, the foregoing polar code encoding method is performed, or the methods including, but not limited to, the methods described in the specific examples are performed, or the foregoing polar code decoding method is performed.

At least one embodiment is described with reference to the flowcharts and/or block diagrams of the method, the device (system), and the computer program product according to embodiments described herein. Computer program instructions are for implementing each process and/or each block in the flowcharts and/or the block diagrams and a combination of a process and/or a block in the flowcharts and/or the block diagrams. These computer program instructions is provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

The computer program instructions is alternatively stored in a computer-readable memory that indicates a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

The computer program instructions is alternatively loaded onto a computer or another programmable data processing device, so that a series of operations and steps are performed on the computer or the another programmable device, to generate computer-implemented processing. Therefore, the instructions executed on the computer or the another programmable device provide steps for implementing a specific function in one or more procedures in the flowcharts and/or in one or more blocks in the block diagrams.

What is claimed is:

1. A communication method for polar code encoding, comprising:
   determining at least K sub-channels based on reliability of a first sub-channel set, wherein
   the K sub-channels carry information bits,
   S sub-channel subsets are determined based on the first sub-channel set,
   an $i^{th}$ sub-channel subset in the S sub-channel subsets includes Ji sub-channels carrying a plurality of auxiliary bits and Ki sub-channels in the K sub-channels,
   the Ki sub-channels carry information bits,
   sequence numbers of the Ji sub-channels carrying the auxiliary bits are after sequence numbers of the Ki sub-channels,
   the sequence numbers of the Ji sub-channels carrying the auxiliary bits are arranged in ascending order from least reliable to most reliable,
   at least one of the plurality of auxiliary bits is a predetermined redundancy constant (RC) bit, and K, S, Ji, and Ki are integers,
   the predetermined RC bit has a fixed value, and
   the auxiliary bits of the plurality of auxiliary bits, including the at least one of the plurality of auxiliary bits that is the predetermined RC bit, are in the Ji sub-channels based on a descending order of the sequence numbers of the Ji sub-channels;
   performing polar encoding on the information bits and the auxiliary bits to generate polar-encoded data; and
   outputting the polar-encoded data.

2. The method according to claim 1, wherein the first sub-channel set is a channel set from which a shorten sub-channel is excluded.

3. The method according to claim 2, wherein the determining at least K sub-channels based on reliability of a first sub-channel set includes:
   determining (K+J) sub-channels based on the reliability of the first sub-channel set, wherein the J sub-channels carry auxiliary bits.

4. The method according to claim 1, wherein (Ki+Ji) sub-channels are determined based on reliability of the $i^{th}$ sub-channel subset, wherein the (Ki+Ji) sub-channels carry information bits and the auxiliary bits.

5. The method according to claim 4, wherein reliability of the (Ki+Ji) sub-channels is higher than reliability of a remaining sub-channel in the $i^{th}$ sub-channel subset.

6. The method according to claim 1, wherein sequence numbers of the Ji sub-channels are greater than a sequence number of a remaining sub-channel in the $i^{th}$ sub-channel subset.

7. The method according to claim 6, wherein the Ki sub-channels are determined based on reliability of a third sub-channel set, wherein the third sub-channel set is the $i^{th}$ sub-channel subset from which the Ji sub-channels are excluded, and the Ki sub-channels carry the information bits.

8. The method according to claim 7, wherein reliability of the Ki sub-channels is higher than reliability of a remaining sub-channel in the third sub-channel set.

9. The method according to claim 1, wherein a total quantity J of the auxiliary bits is determined based on a quantity T of times of checking a check result of the auxiliary bits during polar decoding, and T is a positive integer.

10. A communication apparatus, comprising:
    a logic circuit; and
    a communication interface,
    wherein
    the logic circuit is configured to:
        determine at least K sub-channels based on reliability of a first sub-channel set, wherein
        the K sub-channels carry information bits,
        S sub-channel subsets are determined based on the first sub-channel set,
        an $i^{th}$ sub-channel subset in the S sub-channel subsets includes Ji sub-channels carrying a plurality of auxiliary bits and Ki sub-channels in the K sub-channels,
        the Ki sub-channels carry information bits,
        sequence numbers of the Ji sub-channels carrying the auxiliary bits are after sequence numbers of the Ki sub-channels,
        the sequence numbers of the Ji sub-channels carrying the auxiliary bits are arranged in ascending order from least reliable to most reliable,
        at least one of the plurality of auxiliary bits is a predetermined redundancy constant (RC) bit, and K, S, Ji, and Ki are integers,
        the predetermined RC bit has a fixed value, and
        the auxiliary bits of the plurality of auxiliary bits, including the at least one of the plurality of auxiliary bits that is the predetermined RC bit, are in the Ji sub-channels based on a descending order of the sequence numbers of the Ji sub-channels; and
    perform polar encoding on the information bits and the auxiliary bits to generate polar-encoded data, and
    the communication interface is configured to:
        output the polar-encoded data.

11. The apparatus according to claim 10, wherein the first sub-channel set is a channel set from which a shorten sub-channel is excluded.

12. The apparatus according to claim 11, wherein the logic circuit is further configured to:
    determine (K+J) sub-channels based on the reliability of the first sub-channel set, wherein the J sub-channels carry auxiliary bits.

13. The apparatus according to claim 10, wherein the logic circuit is further configured to:
    determine (Ki+Ji) sub-channels based on reliability of the $i^{th}$ sub-channel subset, wherein the (Ki+Ji) sub-channels carry information bits and the auxiliary bits.

14. The apparatus according to claim 13, wherein reliability of the (Ki+Ji) sub-channels is higher than reliability of a remaining sub-channel in the $i^{th}$ sub-channel subset.

15. The apparatus according to claim 10, wherein sequence numbers of the Ji sub-channels are greater than a sequence number of a remaining sub-channel in the $i^{th}$ sub-channel subset.

16. The apparatus according to claim 15, wherein the logic circuit is further configured to:
    determine the Ki sub-channels based on reliability of a third sub-channel set, wherein the third sub-channel set is the $i^{th}$ sub-channel subset from which the Ji sub-channels are excluded, and the Ki sub-channels carry the information bits.

17. The apparatus according to claim 16, wherein reliability of the Ki sub-channels is higher than reliability of a remaining sub-channel in the third sub-channel set.

18. A non-transitory computer-readable storage medium, wherein the computer-readable storage medium is configured to store instructions, and when the instructions are executed by a processor, cause the processor to:
  determine at least K sub-channels based on reliability of a first sub-channel set, wherein
    the K sub-channels carry information bits,
    S sub-channel subsets are determined based on the first sub-channel set,
    an $i^{th}$ sub-channel subset in the S sub-channel subsets includes Ji sub-channels carrying a plurality of auxiliary bits and Ki sub-channels in the K sub-channels,
    the Ki sub-channels carry information bits,
    sequence numbers of the Ji sub-channels carrying the auxiliary bits are after sequence numbers of the Ki sub-channels,
    the sequence numbers of the Ji sub-channels carrying the auxiliary bits are arranged in ascending order from least reliable to most reliable,
    at least one of the plurality of auxiliary bits is a predetermined redundancy constant (RC) bit, and K, S, Ji, and Ki are integers,
    the predetermined RC bit has a fixed value, and
    the auxiliary bits of the plurality of auxiliary bits, including the at least one of the plurality of auxiliary bits that is the predetermined RC bit, are in the Ji sub-channels based on a descending order of the sequence numbers of the Ji sub-channels;
  perform polar encoding on the information bits and the auxiliary bits to generate polar-encoded data, and
  output the polar-encoded data.

19. The non-transitory computer-readable storage medium according to claim 18, wherein (Ki+Ji) sub-channels are determined based on reliability of the $i^{th}$ sub-channel subset, wherein the (Ki+Ji) sub-channels carry information bits and the auxiliary bits.

20. The non-transitory computer-readable storage medium according to claim 18, wherein the first sub-channel set is a channel set from which a shorten sub-channel is excluded.

* * * * *